United States Patent
Tsuji

(10) Patent No.: US 8,823,343 B2
(45) Date of Patent: Sep. 2, 2014

(54) POWER AMPLIFYING CIRCUIT, DC-DC CONVERTER, PEAK HOLDING CIRCUIT, AND OUTPUT VOLTAGE CONTROL CIRCUIT INCLUDING THE PEAK HOLDING CIRCUIT

(75) Inventor: Nobuaki Tsuji, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 627 days.

(21) Appl. No.: 12/928,825

(22) Filed: Dec. 20, 2010

(65) Prior Publication Data

US 2011/0148375 A1   Jun. 23, 2011

(30) Foreign Application Priority Data

Dec. 22, 2009   (JP) ................. 2009-291350
Dec. 22, 2009   (JP) ................. 2009-291501
Dec. 25, 2009   (JP) ................. 2009-293998
Dec. 25, 2009   (JP) ................. 2009-294003

(51) Int. Cl.
   *G05F 1/00*   (2006.01)
(52) U.S. Cl.
   USPC .......................... 323/271; 323/285
(58) Field of Classification Search
   CPC ................. H02M 3/158; H03F 3/68
   USPC ............ 323/223, 225, 268, 271, 282, 285
   See application file for complete search history.

(56) References Cited

U.S. PATENT DOCUMENTS

| | | | |
|---|---|---|---|
| 5,424,684 A | 6/1995 | Nishioka et al. | |
| 5,461,557 A | 10/1995 | Tamagawa | |
| 5,532,916 A | 7/1996 | Tamagawa | |
| 5,623,222 A | 4/1997 | Tamagawa | |
| 6,025,753 A | 2/2000 | Landherr et al. | |
| 6,727,455 B1 | 4/2004 | Ukai | |
| 7,638,991 B1* | 12/2009 | Kobayashi | 323/272 |
| 7,782,024 B2* | 8/2010 | Fukushi et al. | 323/224 |
| 2012/0146599 A1* | 6/2012 | Oyama | 323/271 |
| 2013/0207625 A1* | 8/2013 | Futamura | 323/271 |

FOREIGN PATENT DOCUMENTS

| | | |
|---|---|---|
| CN | 1208283 A | 2/1999 |
| EP | 0585925 A2 | 2/1992 |
| JP | S61-112408 A | 5/1986 |
| JP | 03-055117 A | 3/1991 |
| JP | UM-A-H05-70017 | 9/1993 |

(Continued)

OTHER PUBLICATIONS

Japan Patent Office, "Notification of Reasons for Refusal" Patent Application No. 2009-291350 of Yamaha Corporation; Date: May 21, 2013; 6 pages.

(Continued)

*Primary Examiner* — Matthew Nguyen
(74) *Attorney, Agent, or Firm* — Pillsbury Winthrop Shaw Pittman LLP

(57) ABSTRACT

A power amplifying circuit includes a first field effect transistor and a second field effect transistor that are connected in series, are interposed between a high potential power line and a low potential power line, and drive a load; a predriver that generates, in response to an input signal, gate voltages applied to the first field effect transistor and the second field effect transistor respectively; and a variable power source that supplies source voltages to the high potential power line and the low potential power line respectively, and is configured to control the source voltages.

2 Claims, 20 Drawing Sheets

(56) References Cited

FOREIGN PATENT DOCUMENTS

| JP | 06165482 A | 6/1994 |
|---|---|---|
| JP | A-H06-314936 | 11/1994 |
| JP | A-2000-091850 | 3/2000 |
| JP | A-2000-174560 | 6/2000 |
| JP | 2002-034269 A | 1/2002 |
| JP | 2003-087684 A | 3/2003 |
| JP | 2008306269 A | 12/2008 |
| JP | 2008306270 A | 12/2008 |
| KR | 2004-18908 Y1 | 6/2006 |
| WO | WO-01-94067 A1 | 12/2001 |

OTHER PUBLICATIONS

The State Intellectual Property Office of the People's Republic of China, "Notification of First Office Action" Patent Application No. 201010603665.3 of Yamaha Corporation; Date: Mar. 20, 2013; 7 pages.

Korean Intellectual Property Office, "Notice of Allowance" Korean Patent Application No. 10-2010-132503 of Yamaha Corporation; Date: Nov. 25, 2011; 2 pages.

Japan Patent Office, "Notification of Reasons for Refusal" Patent Application No. 2009-291350 of Yamaha Corporation; Date: Nov. 7, 2013; 4 pages.

Japan Patent Office, "Notification of Reasons for Refusal" Patent Application No. 2009-291350 of Yamaha Corporation; Date: Feb. 25, 2014; 5 pages.

Japan Patent Office, "Decision to Dismiss an Amendment" Patent Application No. 2009-291350 of Yamaha Corporation; Date: Jul. 1, 2014; 7 pages.

Japan Patent Office, "Final Rejection" Patent Application No. 2009-291350 of Yamaha Corporation; Date: Jul. 1, 2014; 3 pages.

\* cited by examiner

FIG. 18

| HIGH / LOW | BVDD | VPP | VSS | VMM |
|---|---|---|---|---|
| VPP | × | | | - |
| VSS | ○ | × | | - |
| VMM | ○ | × | × | |
| BVSS | ○ | ○ | ○ | × |

POWER AMPLIFYING CIRCUIT, DC-DC CONVERTER, PEAK HOLDING CIRCUIT, AND OUTPUT VOLTAGE CONTROL CIRCUIT INCLUDING THE PEAK HOLDING CIRCUIT

BACKGROUND

The present invention relates to a power amplifying circuit suitable for activating a speaker, or the like, provided in a headphone and a mobile phone.

The present invention also relates to a DC-DC converter for converting a DC voltage into a DC voltage and, more particularly, to a DC-DC converter for converting a single DC voltage into positive and negative DC voltages.

The present invention also relates to a technique for controlling an output voltage of a power source circuit whose output voltage can be adjusted, like a charge pump.

A power amplifying circuit used for activating a speaker, or the like, provided in a headphone and a mobile phone is required to operate at a low voltage and with low power consumption. For this reason, invalid power consumption other than a power consumption used for activating a load, such as a speaker, must be avoided as much as possible. Under related art technology, a source voltage of a power amplifying circuit is switched according to a level of an input signal or an output signal from the power amplifying circuit in order to minimize useless power consumption. FIG. 21 is a circuit diagram showing an example configuration of a related power amplifying circuit of this type. The power amplifying circuit has a variable power source 820, a predriver 830, and a load drive section 840. In order to prevent complication of a drawing, only a direct connection of the predriver 830 with a load drive section 840 is illustrated in FIG. 21.

The variable power source 820 is supplied with a source voltage from a power source, such as a battery (not shown), and applies a positive source voltage VDD between a high potential power line 821 and a ground line 823, as well as applying a negative source voltage VSS between a low potential power line 822 and the ground line 823. The load drive section 840 has a P channel field effect transistor (hereinafter called simply a "transistor") 841 and an N channel transistor 842. A source of the P channel transistor 841 is connected to the high potential power line 821, and a source of the N channel transistor 842 is connected to the low potential power line 822. A drain of the P channel transistor 841 and a drain of the N channel transistor 842 are connected together, and a speaker 850, which is a load, is interposed between a ground line and a node between the drains of the P channel transistor 841 and the N channel transistor 842. The predriver 830 is a circuit that activates the load drive section 840 according to an audio signal supplied from an unillustrated previous stage. The predriver 830 has, as circuits for activating the P channel transistor 841, a P channel transistor 831 and a constant current source 832 that are interposed in series between the high potential power line 821 and the low potential power line 822. In addition, the predriver 830 has, as circuits for activating the N channel transistor 842, a constant current source 833 and an N channel transistor 834 that are interposed in series between the high potential power line 821 and the low potential power line 822. The power amplifying circuit performs control for increasing or decreasing the source voltages VDD and VSS output from the variable power source 820 according to an increase or decrease in peak level of a drive waveform of the speaker 850 in such a way that the drive waveform of the speaker 850 that is a load falls within a range between the source voltages VDD and VSS.

[Patent Document 1] JP-A-2008-306269
[Patent Document 2] JP-A-2008-306270

Incidentally, in the related power amplifying circuit, the predriver 830 cannot generate a gate voltage for activating the P channel transistor 841 when the source voltage of the high potential power line 821 and the source voltage of the low potential power line 822 are not sufficiently greater than an absolute value of a threshold voltage of the P channel transistor 841. When the source voltages are not sufficiently greater than a threshold voltage of the N channel transistor 842, the predriver 830 cannot generate a gate voltage for activating the N channel transistor 842. As mentioned above, in order to assure normal operation of the predriver 830, the related power amplifying circuit must hold the source voltage of the high potential power line 821 and the source voltage of the low potential power line 822 at predetermined levels or more and encounters a problem of the inability to sufficiently lessen power consumption.

Various DC-DC converts for generating positive and negative source voltages from a single source voltage are also provided. FIGS. 22A to 22C show respective example DC-DC converters. In the DC-DC converter shown in FIG. 22A, switches SW51 and SW52 are interposed in series between an input power line given a source voltage VDD and a reference power line (a ground line in the example). Further, an inductor L53 and a capacitor C54 are interposed in series between the reference power line and a common node between the switches SW51 and SW52. A common node between the inductor L53 and the capacitor C54 serves as a first voltage output terminal for outputting a source voltage VPP. In the DC-DC converter, a switch SW55 and an inductor L56 are interposed in series between the input power line and the reference power line. A switch SW57 and a capacitor C58 are interposed in series between the reference power line and a common node between the switch SW55 and the inductor L56. A common node between the switch SW57 and the capacitor C58 serves as a second voltage output terminal for outputting a source voltage VMM. The DC-DC converter alternately iterates operation for turning on the switch SW51 and turning off the switch SW52, thereby letting an electric current running toward the capacitor C54 flow into the inductor L53, to thus store electric energy in the inductor L53, and operation for turning off the switch SW51 and turning on the switch SW52, thereby discharging the electric energy stored in the inductor L53, to thus let the electric current running toward the capacitor C54 flow from the inductor L53. As a consequence, the first voltage output terminal outputs the positive source voltage VPP. In parallel with the operation, the DC-DC converter also alternately iterates operation for turning on the switch SW55 and turning off the switch SW57, thereby letting an electric current running toward the reference power line flow into the inductor L56, to thus store electric energy in the inductor L56, and operation for turning off the switch SW55 and turning on the switch SW57, thereby discharging the electric energy stored in the inductor L56, to thus let an electric current running toward the reference power line flow from the capacitor C58 by way of the inductor L56. Consequently, the second voltage output terminal outputs a negative source voltage VMM.

DC-DC converters shown in FIGS. 22B and 22C are so-called charge pumps. In the DC-DC converter shown in FIG. 22B, a switch SW61, a capacitor C62, and a switch SW63 are interposed in series between an input power line given a source voltage VDD and a reference power line (a ground line in the example). Further, a switch SW64 is interposed between the reference power line and a common node between the switch SW61 and the capacitor C62. A switch SW65 and a capacitor C66 are interposed in series between the reference power line and a common node between the switch SW61 and the capacitor C62. The common node between the switch SW65 and the capacitor C66 serves as a first voltage output terminal for outputting the source voltage VPP. Further, a switch SW67 and a capacitor C68 are interposed in series between the reference power line and the common node between the switch SW63 and the capacitor C62. A common node between the switch SW67 and the capacitor C68 serves as a second voltage output terminal for outputting a source voltage VMM. The DC-DC converter alternately performs, for instance, operation for turning on the switches SW61, SW63, and SW65 and turning off the other switches, thereby applying the source voltage VDD to the capacitors C66 and C62 and operation for turning on the switches SW64 and SW67 and turning off the other switches, thereby letting the capacitor C62 apply a voltage −VDD to the capacitor C68. As a consequence, the first voltage output terminal outputs the positive source voltage VPP=VDD, and the second voltage output terminal outputs a negative source voltage VMM=−VDD.

In the DC-DC converter shown in FIG. 22C, switches SW71 and SW72 are interposed in series between an input power line given a source voltage VDD and a reference power line (a ground line in the example). A capacitor C73 and a switch SW74 are interposed in series between the reference power line and a common node between the switches SW71 and SW72. Further, a switch SW75 and a capacitor C76 are interposed in series between the reference power line and a common node between the switches SW71 and SW72. A common node between the switch SW75 and the capacitor C76 acts as a first voltage output terminal for outputting the source voltage VPP. Further, a switch SW77 and a capacitor C78 are interposed in series between the reference power line and a common node between the capacitor C73 and the switch SW74. A common node between the switch SW77 and the capacitor C78 acts as a second voltage output terminal for outputting a source voltage VMM. Moreover, a switch SW79 is interposed between the common node between the switch SW75 and the capacitor C76 and the common node between the capacitor C73 and the switch SW74. The DC-DC converter has two operation modes. In a first operation mode, the DC-DC converter alternately performs operation for turning on the switches SW71, SW74, and SW75 and turning off the other switches, to thus apply the source voltage VDD to the capacitors C73 and C76, and operation for turning on the switches SW72 and SW77 and turning off the other switches, to thus let the capacitor C73 apply a voltage −VDD to the capacitor C78. As a result, the first voltage output terminal outputs the positive source voltage VPP=VDD, and the second voltage output terminal outputs a negative source voltage VMM=−VDD. In a second operation mode, the DC-DC converter alternately performs operation for turning on the switches SW71 and SW79 and turning off the other switches, to thus apply a voltage VDD/2 to each of the capacitors C73 and C76, and operation for turning on the switches SW72 and SW77 and turning off the other switches, thereby letting the capacitor C73 apply a voltage −VDD/2 to the capacitor C78. The first voltage output terminal outputs the positive source voltage VPP=VDD/2, and the second voltage output terminal outputs a negative source voltage VMM=−VDD/2. For instance, JP-A-6-165482 is available as a document pertaining to a charge pump.

Incidentally, the charge pumps shown in FIGS. 22B and 22C among the related DC-DC converters encounter a problem of the ability to output only a source voltage that is equal in level to the source voltage VDD or a source voltage that is an integral sub-multiple of the source voltage VDD. The DC-DC converter shown in FIG. 22A can adjust the positive source voltage VPP by controlling a time during which the switch SW51 is turned on and also can adjust the negative source voltage VMM by controlling a time during which the switch SW55 is turned on. In order to generate the positive source voltage VPP and the negative source voltage VMM, the two inductors L53 and L56 are required. For this reason, when a DC-DC converter including external inductors is configured, there arises a problem of an increase in the number of terminals to which the inductors are to be mounted. Further, when a DC-DC converter including built-in inductors is implemented as a semiconductor integrated circuit, there arises a problem of an increase in chip area.

A charge pump may often be used for an amplifier that activates a speaker included in a stereo headphone, a mobile phone, or the like, (see; for instance, JP-A-2008-306269), as a power source circuit sharing an operating voltage with the amplifier. Since the charge pump can adjust an output voltage, power consumption of an entire system can be reduced, so long as the voltage applied to the amplifier is adjusted according to a level of an output signal and a level of an input signal of the amplifier. An output voltage control circuit (see FIGS. 23A to 23C) including a so-called peak holding circuit is frequently used for adjusting such an output voltage.

FIGS. 23A to 23C are drawings illustrating example configurations of the output voltage control circuits that control an output of a power source circuit 20 (control of an output of the high level voltage VPP to be more precise) that outputs the high level voltage VPP to an amplifier 30L and the low level voltage VMM to an amplifier 30R. In the output voltage control circuit shown in FIG. 23A, a comparator 612 compares an output signal OUTL of the amplifier 30L that activates a left channel speaker 40L with an output signal OUTR of the amplifier 30R that activates a right channel speaker 40R. A switch 614 is switched according to a comparison result. The output voltage control circuit shown in FIG. 23A switches the switch 614 in such a way that either the signal OUTL or the signal OUTR, whichever is larger, is output as a signal N1. In other words, the comparator 612 and the switch 614 make up a peak holding circuit in the configuration shown in FIG. 23A. An operational amplifier 616 shown in FIG. 23A generates a control signal CVPP linked to a level difference (i.e., VPP-N1) between the high level output voltage VPP of the power source circuit 20 and the signal N1 and outputs the thus-generated control signal to the power source circuit 20. Therefore, so long as a configuration is formed so as to let the power source circuit 20 perform processing for adjusting the high level output voltage VPP in such a way that a signal level of the control signal CVPP becomes smaller, the high level output voltage VPP comes to follow either the output signal OUTL of the amplifier 30L or the output signal OUTR of the amplifier 30R, whichever is larger.

The configuration of the output voltage control circuit shown in FIG. 23B includes a resistor 618 and a constant current source 620 added to the output voltage control circuit shown in FIG. 23A. A power circuit to be controlled by the output voltage control circuit, amplifiers sharing an operating voltage with the power circuit, and others, are omitted from FIG. 23B. The resistor 618 and the constant current 620 shown in FIG. 23B make up a peak holding circuit in conjunction with the comparator 612 and the switch 614. As shown in FIG. 23B, the resistor 618 and the constant current source 620 are interposed in series between the switch 614 and a ground, and a voltage appearing in a common node between the resistor 618 and the constant current source 620 is given as the signal N1 to the operational amplifier 616. The signal N1 assumes a value that results from an offset (R×I) linked to a current value I of the constant current source 620 and a resistance value R of the resistor 618 being subtracted from a signal N2 (either the signal OUTL or the signal OUTR, whichever is larger). Therefore; the output voltage control circuit shown in FIG. 23B controls an output of the power circuit according to a level difference (VPP−N1) between the high level output voltage VPP of the power circuit and the signal N1 (N2−R×I).

The configuration of the output voltage control circuit shown in FIG. 23C includes the output voltage control circuit shown in FIG. 23B additionally provided with a comparator 622 and a switch 624. The comparator 622 and the switch 624 shown in FIG. 23C make up a peak holding circuit along with the comparator 612, the switch 614, the resistor 618, and the constant current source 620. The comparator 622 shown in FIG. 23C compares a signal N3 (either the signal OUTL or the signal OUTR, whichever is larger) with a ground potential VSS. The switch 624 is switched according to a comparison result. Specifically, the switch 624 is switched in such a way that either the signal N3 or the ground potential VSS, whichever is larger, is output as the signal N2. Subsequent operation is identical with operation of the output voltage control circuit shown in FIG. 23B.

However, each of the output voltage control circuits respectively shown in FIGS. 23A to 23C includes a comparator and a switch in the peak holding circuit that makes up a principal section of the output voltage control circuit. Since the comparator and the switch account for a comparatively large circuit area, a circuit area of the peak holding circuit including them as constituent elements also becomes large. A problem of difficulty in miniaturization of the output voltage control circuit is encountered.

SUMMARY

The present invention has been conceived in light of the circumstance and aims at providing a power amplifying circuit capable of decreasing a source voltage of a load drive section to a threshold voltage, or less, of a field effect transistor and sufficiently lessening power consumption.

The present invention also aims at providing a DC-DC converter that requires only one inductor; that can generate both positive and negative source voltages; and that can arbitrarily adjust magnitudes of the respective source voltages.

The present invention also aims at providing technology for enabling miniaturization of an output voltage control circuit that controls an output voltage of a power circuit which supplies an operating voltage to a power amplifying circuit, such as a speaker amplifier, according to operating conditions of the power amplifying circuit.

In order to achieve the above object, according to the present invention, there is provided a power amplifying circuit comprising:

a first field effect transistor and a second field effect transistor that are connected in series, are interposed between a high potential power line and a low potential power line, and drive a load;

a predriver that generates, in response to an input signal, gate voltages applied to the first field effect transistor and the second field effect transistor respectively; and a variable power source that supplies source voltages to the high potential power line and the low potential power line respectively, and is configured to control the source voltages.

Preferably, the first field effect transistor and the second field effect transistor are of the same conductivity type, a drain of the first field effect transistor is connected to one of the high potential power line and the low potential power line, a source of the second field effect transistor is connected to the other of the high potential power line and the low potential power line, and a common node between a source of the first field effect transistor and a drain of the second field effect transistor is connected to the load.

Preferably, the variable power source controls the source voltages so that a drive voltage applied to the load falls within a voltage range between the high potential power line and the low potential power line.

By the above configuration, the power amplifying circuit can control the source voltages supplied to a load drive section independently of the source voltages supplied to the predriver, without being restrained to constraints on the source voltages for the pr-driver. Accordingly, the source voltages applied to the load drive section can be reduced to a level that is a threshold voltage of a field effect transistor or less, as required, so that power consumption can sufficiently be reduced.

According to the present invention, there is also provided a DC-DC converter that, based on an input source voltage applied between an input power line and a reference power line, generates a first output voltage between a first voltage output terminal and the reference power line and a second output voltage between a second voltage output terminal and the reference power line, the DC-DC converter comprising:

a first capacitor that has one electrode connected to the first voltage output terminal and the other electrode connected to the reference power line;

a second capacitor that has one electrode connected to the second voltage output terminal and the other electrode connected to the reference power line;

an inductor; and a switching circuit that selectively forms one of a first current path to a fourth current path based on a control signal, wherein the first current path connects the input power line to the reference power line through the inductor so as to flow an electric current into the inductor in a first direction, the second current path is a looped path in which an electric current flows into the inductor and the first capacitor which are connected in series, the third current path connects the input power line to the reference power line through the inductor so as to flow an electric current into the inductor in a second direction opposite to the first direction; and the fourth current path which is a looped path in which an electric current flows into the inductor and the second capacitor which are connected in series.

According to the present invention, there is also provided a DC-DC converter that, based on an input source voltage applied between an input power line and a reference power line, generates a first output voltage between a first voltage output terminal and the reference power line and a second output voltage between a second voltage output terminal and the reference power line, the DC-DC converter comprising:

a first node and a second node to which a first capacitor is to be connected, wherein the first node is connected to the first voltage output terminal and the second node is connected to the reference power line;

a third node and a fourth node to which a second capacitor is to be connected, wherein the third node is connected to the second voltage output terminal and the fourth node is connected to the reference power line;

a fifth node and a sixth node to which an inductor is to be connected; and a switching circuit that selectively forms one of a first current path to a fourth current path based on a control signal, wherein when the first capacitor, the second capacitor and the inductor are attached to corresponding nodes respectively, the first current path connects the input power line to the reference power line through the inductor so as to flow an electric current into the inductor in a first direction, the second current path is a looped path in which an electric current flows into the inductor and the first capacitor which are connected in series, the third current path connects the input power line to the reference power line through the inductor so as to flow an electric current into the inductor in a second direction opposite to the first direction; and the fourth current path which is a looped path in which an electric current flows into the inductor and the second capacitor which are connected in series.

Preferably, the DC-DC converter further includes a control section that periodically generates, in one period, a control signal for sequentially forming the first current path, the second current path, the third current path, and the fourth current path.

Preferably, the control section generates a period during which none of the first current path through the fourth current path is formed, between a period during which the first current path and the second current path are sequentially formed and a period during which the third current path and the fourth current path are sequentially formed.

Preferably, the control section includes a switch section which opens the second current path when it is detected that the electric current flowing into the inductor in the first direction becomes zero, and opens the fourth current path when it is detected that the electric current flowing into the inductor in the second direction becomes zero.

Preferably, the control section includes an adjusting section which adjusts a time during which the first electric current path is formed or a time during which the second current path is formed, according to a signal applied from the outside.

According to the above configuration, the present invention makes it possible to adjust a magnitude of the first output voltage by adjusting the time during which the first current path is formed and adjust a magnitude of the second output voltage by adjusting the time during which the third current path is formed. Accordingly, it is possible to implement a DC-DC converter that requires only one inductor and can generate positive and negative source voltages and arbitrarily adjust magnitudes of the respective source voltages.

According to the present invention, there is also provided a peak holding circuit, comprising:

a first field effect transistor, a second field effect transistor, and a third field effect transistor whose sources are commonly connected to each other, wherein a first voltage is applied to a gate of the first field effect transistor, a second voltage OUTL which varies around the first voltage is applied to a gate of the second field effect transistor, and a third voltage which varies around the first voltage is applied to a gate of the third field effect transistor, wherein a fourth voltage is applied to respective drains of the first field effect transistor, the second field effect transistor, and the third field effect transistor, and a voltage at a common node among the sources of the first field effect transistor, the second field effect transistor, and the third field effect transistor is output.

According to the present invention, there is also provided an output voltage control circuit for controlling operation of a power source circuit which is supplied with a first voltage and a second voltage and generates a third voltage and a fourth voltage to apply a difference voltage between the third voltage and the fourth voltage as an operating voltage to a first power amplifying circuit and a second power amplifying circuit which amplify input signals according to the applied operating voltage to respectively generate output signals whose voltages vary around the first voltage, the output voltage control circuit comprising:

a peak holding circuit in which one of the third voltage and the fourth voltage is taken as a voltage to be controlled, that includes a first field effect transistor, a second field effect transistor, and a third field effect transistor whose sources are commonly connected to each other, wherein the first voltage is applied to a gate of the first field effect transistor, the output signal is applied to a gate of the second field effect transistor, the output signal is applied to a gate of the third field effect transistor, and the fourth voltage is applied to respective drains of the first field effect transistor, the second field effect transistor, and the third field effect transistor, and wherein the peak holding circuit outputs a voltage at a common node among the sources of the first field effect transistor, the second field effect transistor, and the third field effect transistor; and a control signal generating section that includes a fourth field effect transistor having a drain to which the second voltage is applied and a gate to which a voltage linked to the voltage to be controlled is applied, that generates a control signal for instructing adjustment of the voltage to be controlled so that a difference voltage between the voltage output from the peak holding circuit and a voltage at a source of the fourth field effect transistor becomes small, and that outputs the control signal to the power source circuit.

The first, second, and third field effect transistors included in a peak holding circuit of the present invention act as a drain-grounded amplifying circuit (a source follower circuit) in which the drain voltages of the first, second, and third field effect transistors are fixed to the fourth voltage and in which the output voltage linked to the input voltage (i.e., a first, second, or third voltage) applied to respective gates of the field effect transistors appear in a source. Respective sources of the first, second, and third field effect transistors are commonly connected. Therefore, if all of the three field effect transistors are N channel field effect transistors, a voltage linked to the maximum voltage among the first, second, and third voltages appears on the common node of the sources among the three field effect transistors. If all the transistors are P channel field effect transistors, a voltage linked to the minimum voltage of the first, second, and third voltages appears on the common node. As mentioned above, the peak holding circuit of the present invention makes it possible to selectively output the maximum (or minimum) one of three voltages (the first, second, and third voltages) to be compared, without use of a switch and a comparator. A conceivable another mode of the present invention is to provide an output voltage control circuit including the peak holding circuit as a constituent element.

According to the present invention, there is also provided a peak holding circuit, comprising:

a first field effect transistor, a second field effect transistor, and a third field effect transistor whose sources are commonly connected to each other, wherein a first voltage is applied to a common node between a drain and a gate of the first field effect transistor, a second voltage is applied to respective drains of the second field effect transistor and the third field effect transistor, a third voltage which varies around the first voltage is applied to a gate of the second field effect transistor, and a fourth voltage which varies around the first voltage is applied to a gate of the third field effect transistor, wherein a voltage at a common node among the sources of the first field effect transistor, the second field effect transistor, and the third field effect transistor is output.

According to the present invention, there is also provided an output voltage control circuit for controlling operation of a power source circuit which is supplied with a first voltage and a second voltage and generates a third voltage and a fourth voltage to apply a difference voltage between the third voltage and the fourth voltage as an operating voltage to a first power amplifying circuit and a second power amplifying circuit which amplify input signals according to the applied operating voltage to respectively generate output signals whose voltages vary around the first voltage, the output voltage control circuit comprising:

a peak holding circuit in which one of the third voltage and the fourth voltage is taken as a voltage to be controlled, that includes a first field effect transistor, a second field effect transistor, and a third field effect transistor whose sources are commonly connected to each other, wherein the first voltage is applied to a common node between a drain and a gate of the first field effect transistor, the voltage to be controlled is applied to respective drains of the second field effect transistor and the third field effect transistor, the output signal of the first power amplifying circuit is applied to a gate of the second field effect transistor, and the output signal of the second power amplifying circuit is applied to a gate of the third field effect transistor, and wherein the peak holding circuit outputs a voltage at a common node among the sources of the first field effect transistor, the second field effect transistor, and the third field effect transistor; and a control signal generating section that includes a fourth field effect transistor having a drain and a gate to which a voltage linked to the voltage to be controlled is applied, that generates a control signal for instructing adjustment of the voltage to be controlled so that a difference voltage between the voltage output from the peak holding circuit and a voltage at a source of the fourth field effect transistor becomes small, and that outputs the control signal to the power source circuit.

The second and third field effect transistors included in a peak holding circuit of the present invention in which the drain voltages of the second and third field effect transistors are fixed to the second voltage and in which the output voltage linked to the input voltage (i.e., a second voltage, or a third voltage) applied to respective gates of the field effect transistors appear in a source. In contrast, the drain voltage and the gate voltage of the first field effect transistor are fixed to the first voltage, and a voltage liked to the gate voltage is appeared in the source. Respective sources of the first, second, and third field effect transistors are commonly connected. Therefore, if all of the three field effect transistors are N channel field effect transistors, a voltage linked to the maximum voltage among the first, third, and fourth voltages appears on the common node of the sources among the three field effect transistors. If all the transistors are P channel field effect transistors, a voltage linked to the minimum voltage of the first, third, and fourth voltages appears on the common node. As mentioned above, the peak holding circuit of the present invention makes it possible to output the maximum (or minimum) one of three voltages (the first, third, and fourth voltages) to be compared, without use of a switch and a comparator. A conceivable another mode of the present invention is to provide an output voltage control circuit including the peak holding circuit as a constituent element.

BRIEF DESCRIPTION OF THE DRAWINGS

The above objects and advantages of the present invention will become more apparent by describing in detail preferred exemplary embodiments thereof with reference to the accompanying drawings, wherein:

FIG. 18 is a view showing combination variations of operating voltages for the VPP control circuit or the VMM control circuit;

DETAILED DESCRIPTION OF EXEMPLARY EMBODIMENTS

Modes for implementing the present invention are hereunder described by reference to the drawings.

Figure 1:
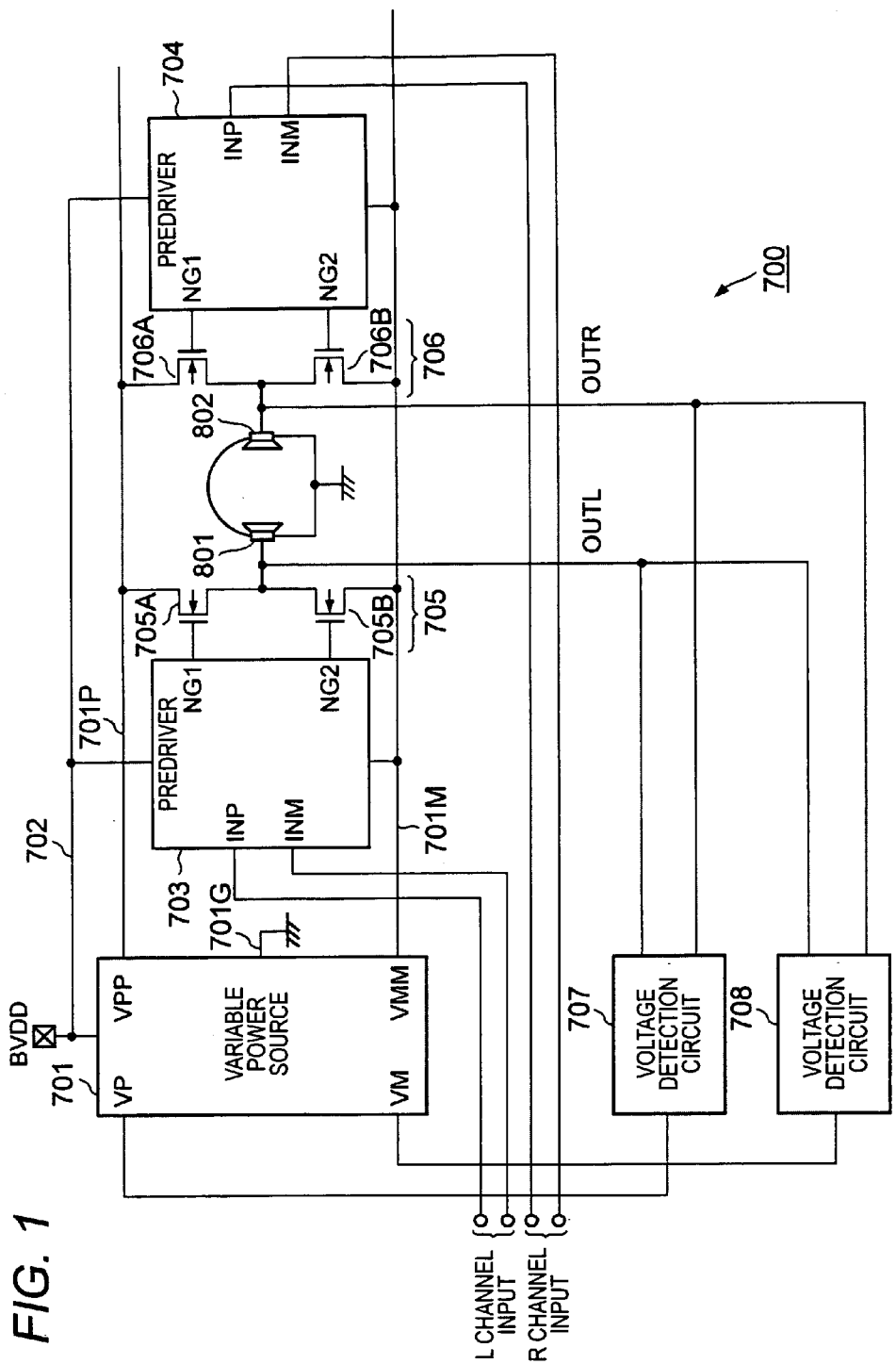
FIG. 1 is a circuit diagram showing a configuration of a power amplifying circuit that is a first embodiment of the present invention.

FIG. 1 is a circuit diagram showing a configuration of a power amplifying circuit that is a first embodiment of the present invention. The power amplifying circuit includes a variable power source 701, predrivers 703 and 704, load drive sections 705 and 706, and voltage detection circuits 707 and 708.

The variable power source 701 is supplied with a source voltage BVDD from a power source, like a battery (not shown); applies a positive source voltage VPP, which is linked to a control voltage VP supplied from the voltage detection circuit 707, between a high potential power line 701P and a ground line 701G; and applies a negative source voltage VMM, which is linked to a control voltage VM supplied from the voltage detection circuit 708, between a low potential power line 701M and the ground line 701G.

The load drive section 705 is a circuit that activates an L channel speaker 801 in a headphone. The load drive section 705 has transistors 705A and 705B of the same conductivity type (an N channel in the present embodiment) interposed in series between the high potential power line 701P and the low potential power line 701M. A drain of the N channel transistor 705A is connected to the high potential power line 701P, and a gate of the same is connected to the predriver 703. A source of the N channel transistor 705B is connected to the low potential power line 701M, and a gate of the same is connected to the predriver 703. A source of the N channel transistor 705A and a drain of the N channel transistor 705B are commonly connected to each other. The common node is connected to one end of the speaker 801 that is a load, and a remaining end of the speaker 801 is connected to the ground. In other words, the N channel transistor 705A and the speaker 801 make up a source follower (a drain-grounded amplifying circuit). The N channel transistor 705B and the speaker 801 make up a source-grounded amplifying circuit.

The load drive section 706 is a circuit for activating an R channel speaker 802 in the headphone. Like the load drive section 705, the load drive section 706 has N channel transistors 706A and 706B that are interposed in series between the high potential power line 701P and the low potential power line 701M.

The predriver 703 is a circuit that amplifies two L channel input signals of positive and negative phases, thereby generating gate voltages to be applied to the N channel transistors 705A and 705B. The source voltage BVDD is applied to a positive power terminal of the predriver 703 by way of a high potential power line 702 differing from the high potential power line 701P, and the source voltage VMM is applied to a negative power terminal of the predriver 703 by way of the low potential power line 701M. The predriver 703 operates on, as a power source, a voltage developing between the positive power terminal and the negative power terminal.

The predriver 704 is a circuit that amplifies two R channel input signals of positive and negative phases, thereby generating gate voltages to be applied to the N channel transistors 706A and 706B. Like the predriver 703, the source voltage BVDD is applied to a positive power terminal of the predriver 704, and the source voltage VMM is applied to a negative power terminal of the predriver 704. The predriver 704 operates on, as a power source, a voltage developing between the positive power terminal and the negative power terminal.

The voltage detection circuit 707 is a circuit that detects the highest voltage among an output voltage OUTL of the load drive section 705, an output voltage OUTR of the load drive section 706, and a 0V and that outputs to the variable power source 701 the control voltage VP that is a result of addition of the detected voltage to a positive offset voltage. The voltage detection circuit 708 is a circuit that detects the lowest voltage among the output voltage OUTL of the load drive section 705, the output voltage OUTR of the load drive section 706, and the 0V and that outputs to the variable power source 701 the control voltage VM that is a result of addition of the detected voltage to the negative offset voltage. The positive offset voltage is about +0.2V, and the negative offset voltage is about −0.2V.

Figure 2:
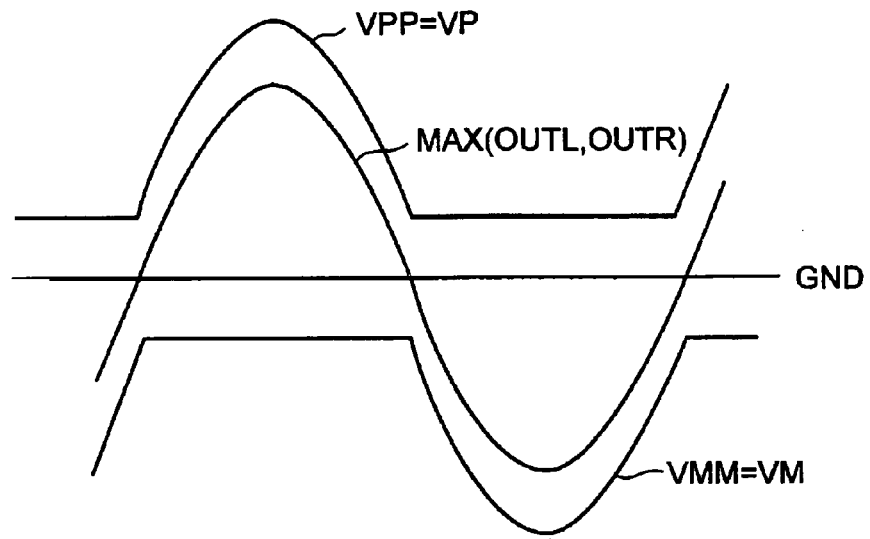
FIG. 2 is a view showing an example method for controlling a source voltage of the first embodiment.
Figure 3:
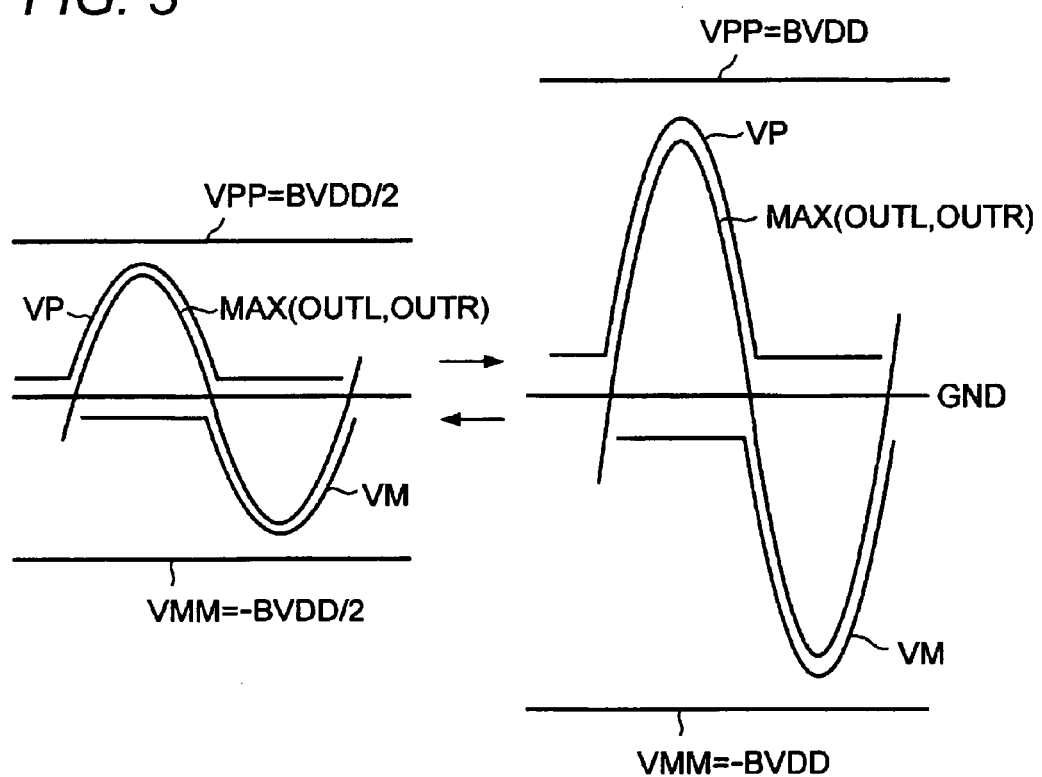
FIG. 3 is a view showing another example method for controlling the source voltage of the first embodiment.

The variable power source 701 includes various conceivable modes. In a first mode, as shown in FIG. 2, the variable power source 701 outputs the source voltage VPP equal to the control voltage VP and the source voltage VMM equal to the control voltage VM. In a second mode, as shown in FIG. 3, when an absolute value of the control voltage VP and an absolute value of the control voltage VM are smaller than a threshold value Vth=BVDD/2, the variable power source 701 outputs the source voltage VPP=BVDD/2 and the source voltage VMM=−BVDD/2. When the absolute value of the control voltage VP and the absolute value of the control voltage VM are a threshold value Vth=BVDD/2 or more, the variable power source 701 outputs the source voltage VPP=BVDD and the source voltage VMM=−BVDD. In any of the modes, when an amplitude of an output signal applied to the speakers 801 and 802, which are loads, is small, the source voltages VPP and VMM that are small voltage values are imparted to the load drive sections 705 and 706. Useless electric power consumed by the transistors 705A, 705B, 706A, and 706B is reduced, so that efficiency can be enhanced.

In the embodiment, the source voltage VPP−VMM of the load drive sections 705 and 706 can be freely controlled while the source voltage BVDD−VMM of the predrivers 703 and 704 is held at a high level. Therefore, power consumption of the N channel transistors 705A, 705B, 706A, and 706B can effectively be reduced. A resultant advantage is now described as follows, by reference to a specific example.

In the specific example, the source voltage BVDD is 3.7V. The variable power source 701 changes the source voltage VPP from 0.2V to 1.8V according to an amplitude of the output signal OUTL and an amplitude of the output signal OUTR, thereby changing the source voltage VMM from −0.2V to −1.8V. In this case, in order to activate; for instance, the N channel transistor 705A making up a source-follower circuit, a gate voltage NG1 equal to or greater than a result of addition of the threshold voltage of the N channel transistor 705A, a maximum value 1.8V of the output voltage OUTL, and a predetermined overdrive voltage (about 0.2V) must be output from the predriver 703 to the N channel transistor 705A. The source voltage BVDD=3.7V is applied to the predriver 703. So long as such a source voltage is supplied, the normal predriver 703 utilizing existing technology can sufficiently output the gate voltage NG1 fulfilling a requirement. In order to activate the N channel transistor 705B, the gate voltage NG2 equal to or greater than a result of addition of the threshold voltage of the N channel transistor 705B and a predetermined overdrive voltage (about 0.2V) to the source voltage VMM must be output from the predriver 703 to the N channel transistor 705B. Since the source voltage BVDD=3.7V is applied to the predriver 703, such a gate voltage NG2 can be output from the predriver 703 to the N channel transistor 705B. Although an explanation is given by means of taking, as an example, a relationship between the load drive section 705 and the predriver 703. The same also applies to a relationship between the load drive section 706 and the predriver 704.

Since each of the load drive sections 705 and 706 is made up of two transistors of the same conductivity type (an N channel type in the embodiment), the present embodiment yields an advantage of the ability to reduce a minimum value of a source voltage developing between the high potential power line 701P and the low potential power line 701M when compared with a minimum value acquired by two transistors of different conductivity types. For instance, if the N channel transistor 705A of the load drive section 705 is replaced with the P channel transistor, in order to turn on the P channel transistor, the predriver 703 must output the gate voltage NG1 that is lower than the voltage VPP of the high potential power line 701P by an amount equivalent to an addition of an absolute value of the threshold voltage of the P channel transistor to the predetermined overdrive voltage. In order to let the predriver 703 output such a gate voltage NG1, at least a voltage that is equal in level to a sum of an absolute value of the threshold voltage of the P channel transistor and a predetermined overdrive voltage must be caused to arise between the high potential power line 701P and the low potential power line 701M. When the source voltage existing between the high potential power line 701P and the low potential power line 701M becomes lower than the voltage, the P channel transistor cannot be activated, so that normal amplifying operation is not performed. On the contrary, in the present embodiment, each of the load drive sections 705 and 706 is made up of two transistors of the same conductivity type (an N channel type in the embodiment). Therefore, the source voltage developing between the high potential power line 701P and the low potential power line 701M can be significantly reduced without being subject to such constraints. For instance, the source voltage VPP of the high potential power line 701P can also be set to 0.2V, whereas the source voltage VMM of the low potential power line 701M can also be set to −0.2V. The reason for this is that, even when such settings are employed, respective gate voltages for turning on the respective N channel transistors 705A, 705B, 706A, and 706B can be output from the predrivers 703 and 704, so long as the source voltage BVDD for the predrivers 703 and 704 are made sufficiently large. Therefore, according to the present embodiment, a minimum value of the source voltage developing between the high potential power line 701P and the low potential power line 701M can be made smaller than that achieved when each of the load drive sections 705 and 706 is made up of two transistors of different conductivity types.

Figure 4:
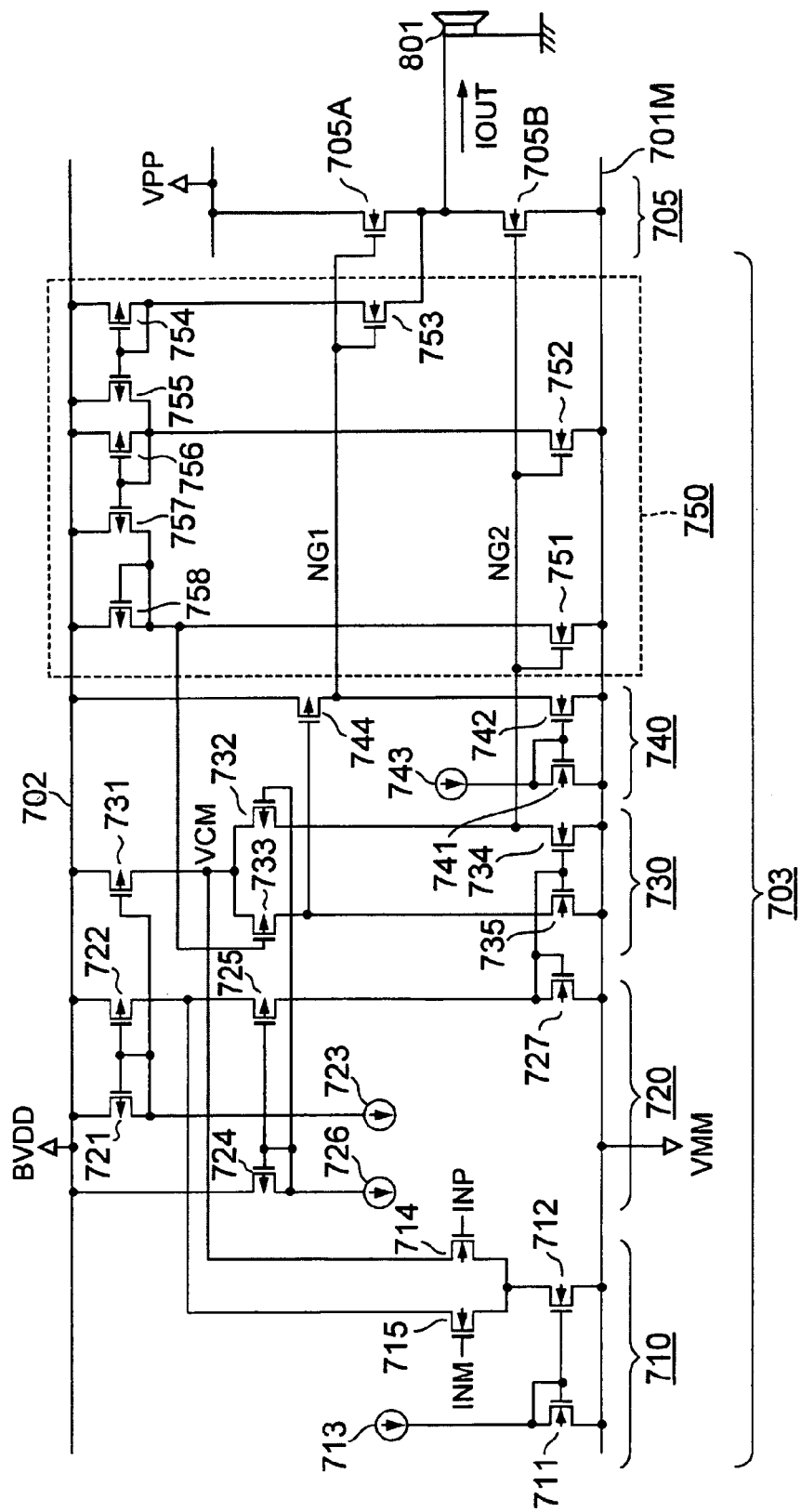
FIG. 4 is a circuit diagram showing a specific example configuration of a predriver of the first embodiment.
Figure 5A:
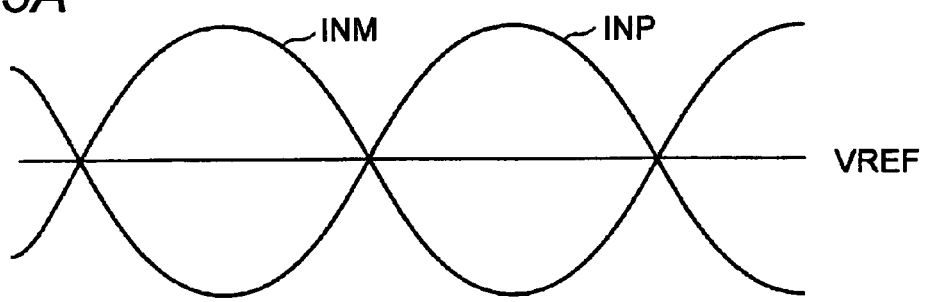
FIGS. 5A to 5D are waveform charts illustrating waveforms of respective sections of the first embodiment.
Figure 5B:
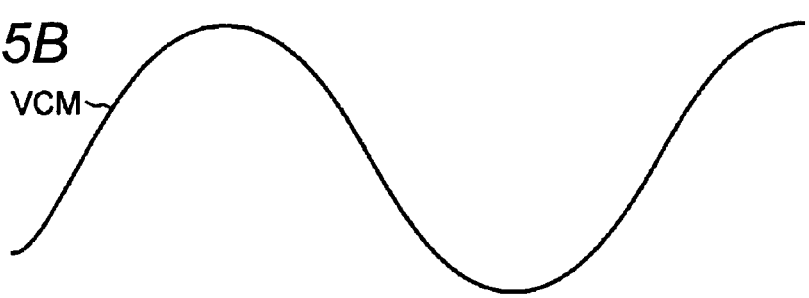
Figure 5C:
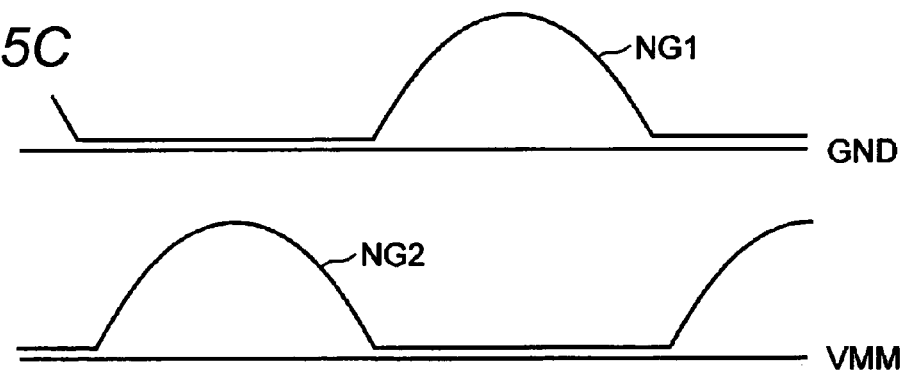
Figure 5D:
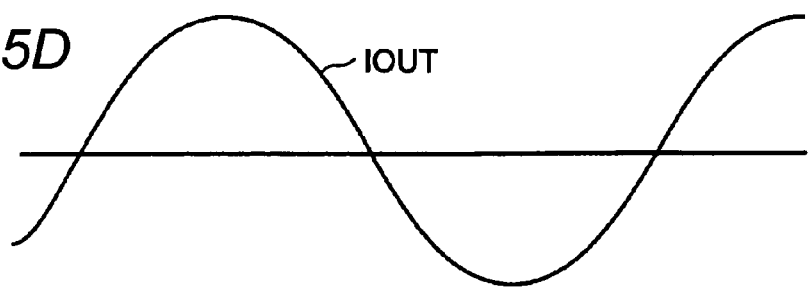

FIG. 4 is a circuit diagram showing an example configuration of the pre-drier 703 of the embodiment. The predriver 704 also assumes a configuration analogous to that of the predriver 70 shown in FIG. 4. In order to facilitate comprehension of the overall configuration and operation of the predriver 703 and the load drive section 705, the load drive section 705 is also illustrated additionally in FIG. 4.

As shown in FIG. 4, the predriver 703 is built from a first amplifying section 710, a second amplifying section 720, a third amplifying section 730, a fourth amplifying section 740, and an idling current adjusting section 750.

In the first amplifying section 710, a source of an N channel transistor 711 and a source of an N channel transistor 712 are connected to the low potential power line 701M. A gate of the N channel transistor 711 and a gate of the N channel transistor 712 are connected to a drain of the N channel transistor 711, and the drain of the N channel transistor 711 is connected to a constant current source 713. Therefore, a saturation current value of the N channel transistor 712 is proportional to a current value of the constant current source 713. Two input signals INP and INM of positive and negative phases are applied to a gate of an N channel transistor 714 and a gate of an N channel transistor 715, and a source of the N channel transistor 714 and a source of the N channel transistor 715 are connected to a drain of the N channel transistor 712. The N channel transistors 714 and 715 and the N channel transistor 712 make up a differential amplifier that performs differential amplification of the input signals INP and INM.

In the second amplifying section 720, a source of a P channel transistor 721 and a source of a P channel transistor 722 are connected to the high potential power line 702. A gate of the P channel transistor 721 and a gate of the P channel transistor 722 are connected to the drain of the P channel transistor 721, and a constant current source 723 is connected to a drain of the P channel transistor 721. Therefore, a saturation current value of the P channel transistor 722 is proportional to a current value of the constant current source 723. A drain of the P channel transistor 722 is connected to a source of a P channel transistor 725, and a drain of the N channel transistor 715 in the first amplifying section 710 is also connected to the drain of the P channel transistor 722. A drain of the P channel transistor 725 is connected to a drain and a gate of an N channel transistor 727, and a source of the N channel transistor 727 is connected to the low potential power line 701M. A source of a P channel transistor 724 is connected to the high potential power line 702, and a gate and a drain of the P channel transistor 724 are connected to a constant current source 726. A common node between the gate and the drain of the P channel transistor 724 is connected to a gate of the P channel transistor 725. In the above-described second amplifying section 720, the P channel transistor 722 works as a constant current source, and an electric current resulting from subtraction of a drain current of the N channel transistor 715 of the first amplifying section 710 from a drain current of the P channel transistor 722 flows into the N channel transistor 727 by way of the P channel transistor 725.

In the third amplifying section 730, a source of a P channel transistor 731 is connected to the high potential power line 702, and a gate of the P channel transistor 731 is connected to a common node between the constant current source 723 and the gate and the drain of the P channel transistor 721 of the second amplifying section 720. Accordingly, a saturation current of the P channel transistor 731 becomes proportional to a current value of the constant current source 723. A source of a P channel transistor 732 and a source of a P channel transistor 733 are connected to a drain of the P channel transistor 731. A drain of the N channel transistor 714 in the first amplifying section 710 is connected to the drain of the P channel transistor 731. A gate of the P channel transistor 732 is connected to a common node between a constant current source 726 and the gate and the drain of the P channel transistor 724 in the second amplifying section 720. Further, a gate of the P channel transistor 733 is connected to a drain of a P channel transistor 758 in the idling current adjusting section 750. A drain of the P channel transistor 732 is connected to a drain of an N channel transistor 734, and a drain of the P channel transistor 733 is connected to a drain of an N channel transistor 735. A source of the N channel transistor 734 and a source of the N channel transistor 735 are connected to the low potential power line 701M. A gate of the N channel transistor 734 and a gate of the N channel transistor 735 are connected to a common node between the gate and the drain of the N channel transistor 727 in the second amplifying section 720. A drain voltage of the P channel transistor 732 turns into the gate voltage NG2 for the N channel transistor 705B in the load drive section 705, and a drain voltage of the P channel transistor 733 is applied to a gate of a P channel transistor 744 in the fourth amplifying section 740.

The above-described third amplifying section 730 is a differential amplifier, and the P channel transistors 732 and 733 make up a differential transistor pair. An electric current flowing into a common source of the differential transistor pair comes to an electric current resulting from subtraction of a drain current of the N channel transistor 714 of the first amplifying section 710 from a drain current of the P channel transistor 731 acting as a constant current source. In the meantime, the N channel transistors 734 and 735 act as loads on the differential transistor pair. A saturation current value of the N channel transistors 734 and 735 becomes proportional to a drain current of the N channel transistor 727 in the second amplifying section 720.

In the fourth amplifying section 740, a source of an N channel transistor 741 and a source of an N channel transistor 742 are connected to the low potential power line 701M. A gate of the N channel transistor 741, a gate of the N channel transistor 742, and a drain of the N channel transistor 741 are connected to a constant current source 743. Therefore, a saturation current value of the N channel transistor 742 becomes proportional to the current value of the constant current source 743. A source of the P channel transistor 744 is connected to the high potential power line 702, and a drain of the P channel transistor 744 is connected to a drain of the N channel transistor 742. The gate of the P channel transistor 744 is connected to the drain of the P channel transistor 733 in the third amplifying section 730. The N channel transistor 742 acts as a load on the P channel transistor 744, and the P channel transistor 744 makes up a source-grounded amplifying circuit that amplifies a drain voltage of the P channel transistor 733 of the third amplifying section 730 that is applied to the gate of the P channel transistor 744. A drain voltage of the P channel transistor 744 that is an output signal from the source-grounded amplifying circuit acts as a gate voltage NG1 for the N channel transistor 705A in the load drive section 705.

In the idling current adjusting section 750, a source of an N channel transistor 751 and a source of an N channel transistor 752 are connected to the low potential power line 701M. The gate voltage NG2 that is equal to the gate voltage applied to the N channel transistor 705B in the load drive section 705 is applied to a gate of the N channel transistor 751 and a gate of the N channel transistor 752. A source of an N channel transistor 753 is connected to a source of the N channel transistor 705A of the load drive section 705, and the gate voltage NG1 that is equal to that applied to the N channel transistor 705A is applied to a gate of the N channel transistor 753. Respective sources of P channel transistors 754, 755, 756, 757, and 758 are connected to the high potential power line 702. A drain and a gate of the P channel transistor 754 and a gate of the P channel transistor 755 are connected to a drain of the N channel transistor 753. A drain of the P channel transistor 755 and a drain of the P channel transistor 756 are connected to a drain of the N channel transistor 752. A gate of the P channel transistor 756 and a gate of the P channel transistor 757 are connected to a common node among the drain of the P channel transistor 755, the drain of the P channel transistor 756, and the drain of the N channel transistor 752. A drain of the P channel transistor 757 and a drain of the P channel transistor 758 are connected to a drain of the N channel transistor 751. A gate of the P channel transistor 758 is connected to a common node among the drain of the P channel transistor 757, the drain of the P channel transistor 758, and the drain of the N channel transistor 751. Further, the gate of the P channel transistor 733 of the third amplifying section 730 is also connected to the common node.

The above is a detailed configuration of the predriver 703.

Operation of the predriver 703 is now described by reference to FIGS. 5A to 5D. For instance, when a saturation current of the N channel transistor 712 is 2 I0 and when a voltage of each of the two-phase input signals INP and INM assumes a reference level VREF, each of drain currents of the N channel transistors 714 and 715 assumes I0.

When the input signal INP in this state has fallen to VREF−ΔV and when the input signal INM has risen to VREF+ΔV, a drain current of the N channel transistor 714 decreases to; for increase, I0−ΔI0, and the drain current of the N channel transistor 715 increases to I0+ΔI0.

When the drain current of the N channel transistor 714 has decreased, the amount of electric current flowing into the common source between the P channel transistors 732 and 733 in the third amplifying section 730 correspondingly increases. When the drain current of the N channel transistor 715 has increased, the drain current of the N channel transistor 727 in the second amplifying section 720 correspondingly decreases. The saturation current value of the N channel transistors 734 and 735 in the third amplifying section 730 decreases.

Therefore, as a decrease −ΔV in the reference level VREF of the input signal INP and an increase +ΔV in the reference level VREF of the input signal INM become greater, the potential VCM of the common source of the P channel transistors 732 and 733 in the third amplifying section 730 increases, whereupon the drain voltage of the P channel transistor 732 and the drain voltage of the P channel transistor 733 also increase. As a consequence, the gate voltage NG2 supplied from the third amplifying section 730 to the N channel transistor 705B in the load drive section 705 rises, and the drain current of the N channel transistor 705B increases. By contrast, the gate voltage NG1 supplied from the fourth amplifying section 740 to the N channel transistor 705A of the load drive section 705 comes to decrease toward a ground level.

As the gate voltage NG1 approaches the ground level, the drain current of the N channel transistor 753 and the drain current of the P channel transistor 754 also approaches a value of 0 in the idling current adjusting section 750. A chain of events consequently occurs as provided below; namely, a decrease in drain current of the P channel transistor 755→an increase in drain current of the P channel transistor 756 and a decrease in drain and gate potentials of the P channel transistor 756→an increase in the drain current of the P channel transistor 757, a decrease in drain current of the P channel transistor 758, and a rise in drain and gate potentials of the P channel transistor 758. When the drain potential of the P channel transistor 758 has risen, the drain potential of the P channel transistor 733 in the third amplifying section 730 decreases. Therefore, the gate voltage NG1 supplied from the fourth amplifying section 740 to the N channel transistors 705A and 753 increases, and the drain current of the N channel transistors 705A and 753 increases.

Since negative feedback, such as that mentioned above, acts on the predriver, the drain current of the N channel transistor 705A does not fall to zero for a period of time during which the N channel transistor 705B is activating the speaker 801 as a result of flow of the drain current into the N channel transistor 705B, so that a feeble idling electric current flows into the N channel transistor 705A.

Next, when the input signal INP rises to a level VREF+ΔV and when the input signal INM falls to a level VREF−ΔV, the drain current of the N channel transistor 714 increases to; for instance, I0+ΔI0, and the drain current of the N channel transistor 715 falls to I0−ΔI0.

When the drain current of the N channel transistor 714 has increased, the electric current flowing into the common source of the P channel transistors 732 and 733 correspondingly decreases in the third amplifying section 730. When the drain current of the N channel transistor 715 has decreased, the drain current of the N channel transistor 727 in the second amplifying section 720 increases by an amount corresponding to the decrease. Therefore, the saturation current of the N channel transistors 734 and 735 in the third amplifying section 730 increases.

Therefore, in the third amplifying section 730, as the increase +ΔV in the reference level VREF of the input signal INP and the decrease −ΔV in the reference level VREF of the input signal INM become greater, the potential VCM of the common source of the P channel transistors 732 and 733 decreases, so that the drain voltage of the P channel transistor 732 and the drain voltage of the P channel transistor 733 also decrease. As a consequence, the gate voltage NG1 supplied from the fourth amplifying section 740 to the N channel transistor 705A of the load drive section 705 increases, and the drain current of the N channel transistor 705A increases. In contrast, the gate voltage NG2 supplied from the third amplifying section 730 to the N channel transistor 705B of the load drive section 705 approaches the level VMM of the low potential power line 701M.

When the gate voltage NG2 approached the level VMM of the low potential power line 701M, the drain current of the N channel transistors 751 and 752 approach zero in the idling current adjusting section 750. As a consequence, the drain potential of the P channel transistor 758 rises. A decrease in the drain potential of the P channel transistor 733 and an increase in the drain potential of the P channel transistor 732 occur in the third amplifying section 730, whereby the gate voltage NG2 applied to the N channel transistor 705B increases, and the drain current of the N channel transistor 705B increases. Since negative feedback, such as that mentioned above, acts on the predriver, the drain current flows into the N channel transistor 705A. For a period of time during which the N channel transistor 705A is activating the speaker 801, the drain current of the N channel transistor 705B does not come to zero, and a feeble idling electric current flows into the N channel transistor 705B.

The above is operation of the predriver 703 shown in FIG. 4.

According to the specific embodiment, since the predriver 703 lets a feeble idling electric current flow into the N channel transistors 705A and 705B at all times, it is possible to prevent occurrence of crossover distortion, which would otherwise arise when a transition is effected from activation of the load by either the N channel transistor 705A or 705B to activation of the load by a remaining one of the two N channel transistors.

Other Embodiments

Although the first embodiment of the present invention has been described above, additional types of embodiments of the present invention are also conceivable. For instance, in the present embodiment, each of the load drive sections 705 and 706 is made up of two N channel transistors, but the load drive sections each may also be built from two P channel transistors. Further, in the present embodiment, while the ground line 701G is taken as a reference, the positive source voltage VPP is applied to the high potential power line 701P, and the negative source voltage VMM is applied to the low potential power line 701M. However, there can also be adopted a configuration in which, while the low potential power line 701M is taken as a ground line, the variable power source 701 generates a single source voltage and applies the thus-generated source voltage between the high potential power line 701P and the low potential power line 701M (the ground line).

Next, a second embodiment of the present invention is hereunder described by reference to the drawings.

Figure 6:
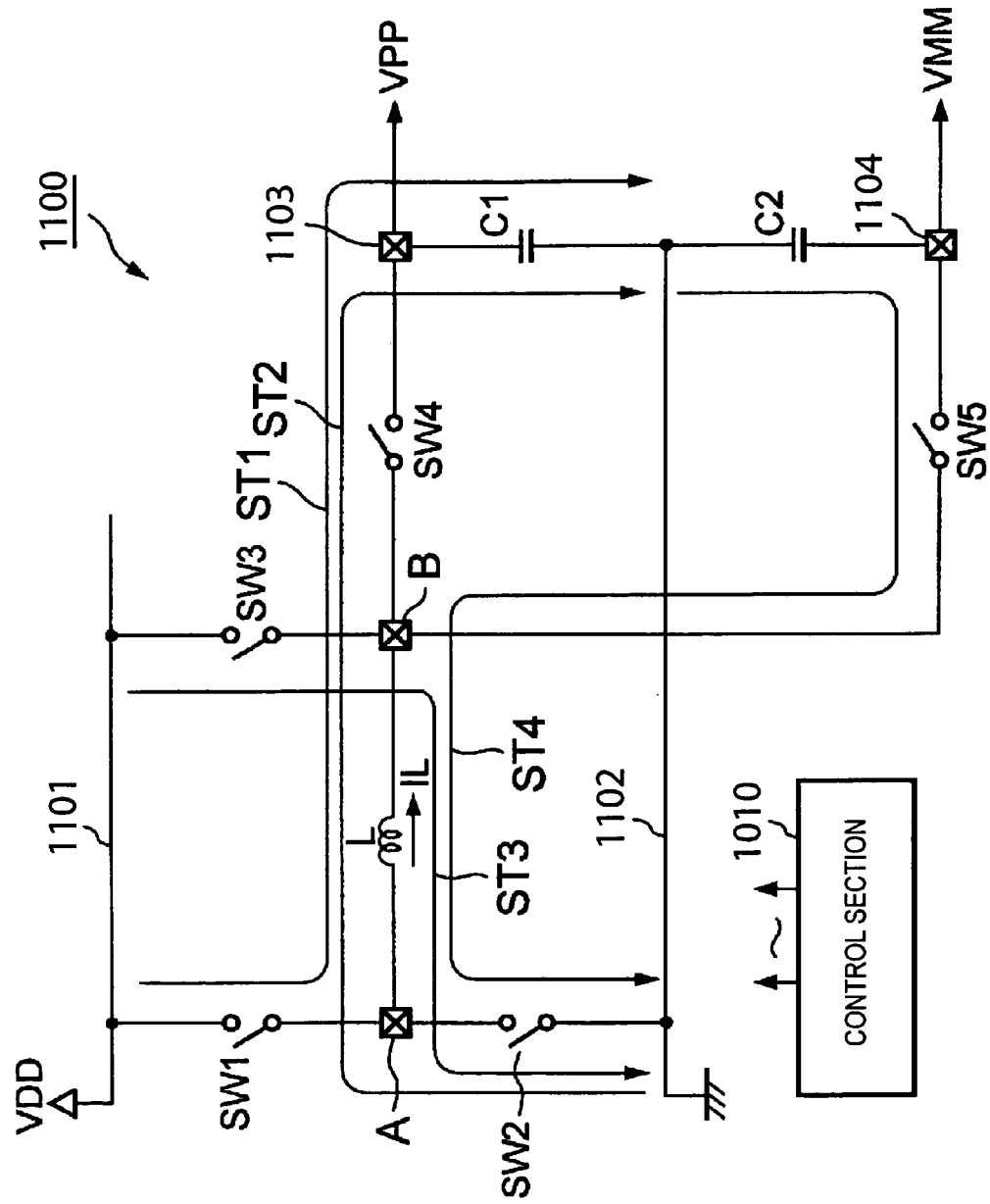
FIG. 6 is a circuit diagram showing a configuration of a DC-DC converter that is a second embodiment of the present invention.

FIG. 6 is a circuit diagram showing a configuration of a DC-DC converter 1100 that is a second embodiment of the present invention. The DC-DC converter 1100 is equivalent to the variable power source 701 shown in FIG. 1. The DC-DC converter 1100 has an input power line 1101 and a reference power line 1102. In FIG. 6, the reference power line 1102 is grounded. An input source voltage VDD is applied between the input power line 1101 and the reference power line 1102 from a fixed power source, such as a battery (not shown). The DC-DC converter 1100 is a circuit that, according to the input source voltage VDD applied between the input power line 1101 and the reference power line 1102, lets the positive source voltage VPP occur between a first voltage output terminal 1103 and the reference power line 1102 and also lets the negative source voltage VMM, occur between a second voltage output terminal 1104 and the reference power line 1102.

The DC-DC converter 1100 has capacitors C1 and C2. The capacitor C1 is interposed between the first voltage output terminal 1103 and the reference power line 1102. The capacitor C2 is interposed between the second voltage output terminal 1104 and the reference power line 1102. The DC-DC converter 1100 has terminals A and B. An external inductor L is interposed between the terminals A and B.

The DC-DC converter 1100 has five switches SW1 to SW5 and a control section 1010 for controlling activation and deactivation of each of the switches SW1 to SW5. The switch SW1 is interposed between the input power line 1101 and the terminal A. The switch SW2 is interposed between the reference power line 1102 and the terminal A. The switch SW3 is interposed between the input power line 1101 and the terminal B. The switch SW4 is interposed between the terminal B and the terminal 1103. The switch SW5 is interposed between the terminal B and the terminal 1104. The switches SW1 to SW5 make up a switching circuit for making illustrated four types of current paths ST1 to ST4. A first current path ST1 is a current path that connects the input power line 1101 to the reference power line 1102 by way of the inductor L, thereby letting an electric current running in a direction (hereinafter called a "first direction") from the terminal A to the terminal B flow into the inductor L. A second current path ST2 is a looped current path in which the inductor L and the capacitor C1 are interposed in series. A third current path ST3 is a current path that connects the input power line 1101 to the reference power line 1102 by way of the inductor L, thereby letting an electric current flow into the inductor L in a second direction opposite to the first direction. A fourth current path ST4 is a looped current path in which the inductor L and the capacitor C2 are interposed in series. The control section 1010 generates a control signal for controlling activation/deactivation of each of the switches SW1 to SW5 and making a desired one of the four types of current paths ST1 to ST4. The control section 1010 controls, according to the level of the desired output voltage VPP and the level of the output voltage VMM, a duration of a period in which the current paths ST1 and ST3 are formed.

Figure 7:
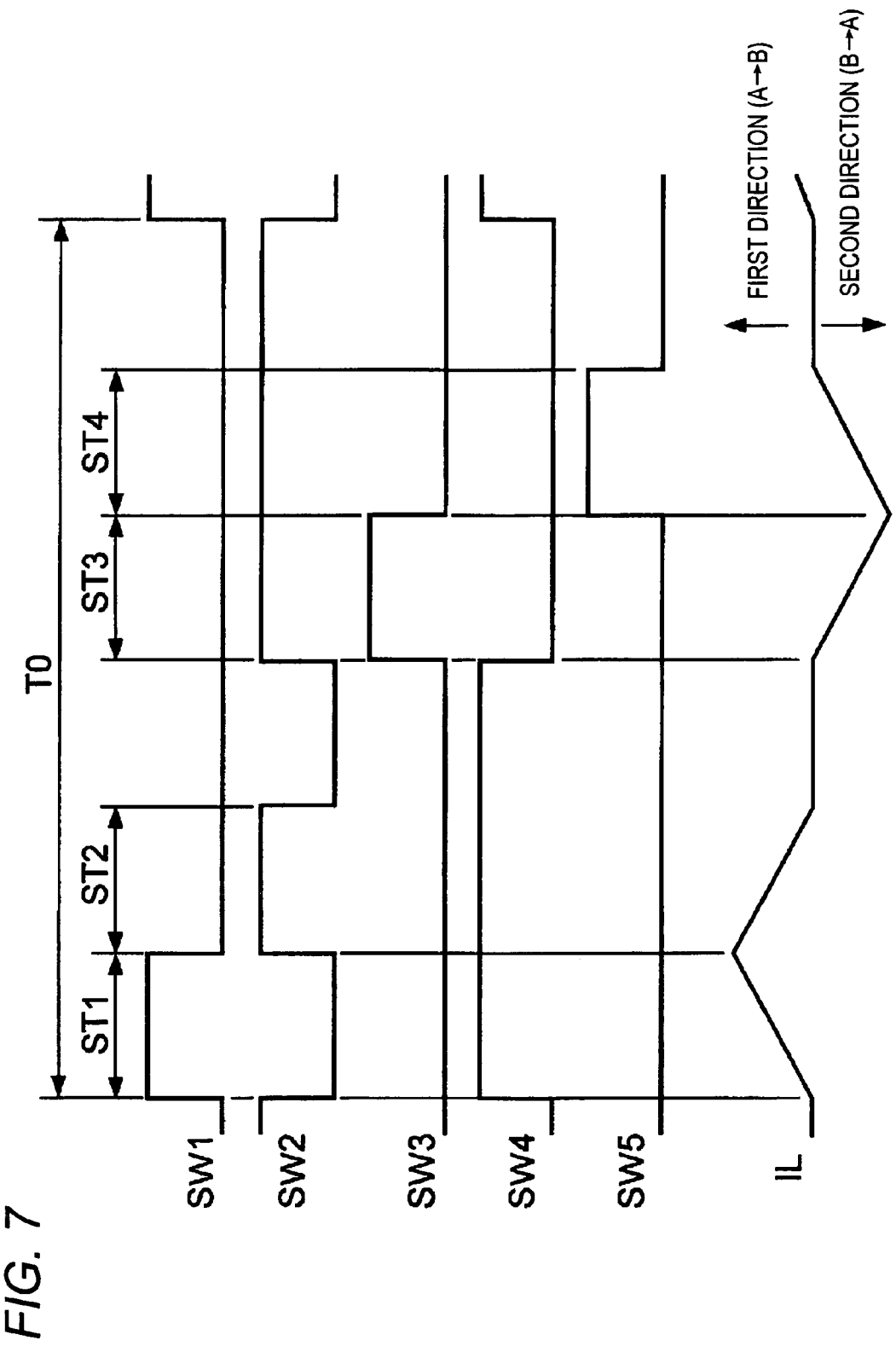
FIG. 7 is a timing chart showing operation of the second embodiment.

FIG. 7 is a timing chart showing example operation of the DC-DC converter 1100 of the present embodiment. The timing chart explicitly shows respective periods during which the respective foregoing current paths ST1, ST2, ST3, and ST4 are formed. As shown in FIG. 7, the control section 1010 iterates operation for sequentially making the current paths ST1, ST2, St3, and ST4 every period T0 having a given duration. To be more specific, the control section 1010 outputs, at a switching point of the period T0, a control signal that continually activates the switches SW1 and SW4 and deactivates the other switches for a given time, thereby making the current path ST1. During the period, an electric current IL that runs in the first direction and that increases at a gradient proportional to a difference between the source voltage VDD and a charge voltage VPP for the capacitor C1 flows into the inductor L. Next, the control section 1010 outputs a control signal that continually activates the switches SW2 and SW4 and deactivates the other switches for a given time, thereby making the current path ST2. During the period, the capacitor C1 is charged with, by way of the current path ST2, the electric current IL that flows into the inductor L in the first direction. In addition, the electric current IL gradually decreases during the period, to thus finally come to zero. In a preferred mode, the control section 1010 opens the current path ST2 when the electric current IL has come to zero.

After having opened the current path ST2, the control section 1010 does not make any of the current paths ST1 through ST4 before completion of a first half of the period T0. When a latter half of the period T0 begins, the control section 1010 outputs a control signal that continually activates the switches SW2 and SW3 and deactivates the other switches for a given time, thereby making the current path ST3. An electric current IL that runs in a second direction and that increases at a gradient proportional to the source voltage VDD flows into the inductor L during the period. Next, the control section 1010 outputs a control signal that continually activates the switches SW2 and SW5 and deactivates the other switches for a given time, thereby making the current path ST4. During the period, the capacitor C2 is charged with, by way of the current path ST4, the electric current IL that flows into the inductor L in the second direction. The electric current IL gradually decreases during the period, to thus come to zero. In a preferred mode, the control section 1010 opens the current path ST4 when the electric current IL has come to zero. After having opened the current path ST4, the control section 1010 does not make any of the current paths ST1 to ST4 before the period T0 is switched to a new period T0. The above is operation of the DC-DC converter 1100 performed during one period of the converter.

In the above operation, an amount of electric charges stored in the capacitor C1 during one period T0 becomes equal to a value of integral of the electric current IL flowing in the inductor L in the first direction in the period during which the current paths ST1 and ST2 are formed. Further, the value of integral of the electric current IL running in the first direction is proportional to a duration of the period in which the current path ST1 is held. Accordingly, the output voltage VPP that develops across the capacitor C1 as a result of a ratio of a period of making of the current path ST1 to the period T0 being increased or decreased can arbitrarily be increased or decreased. The amount of electric charges stored in the capacitor C2 in one period T0 becomes equal to a value of integral of the electric current IL flowing into the inductor L in the second direction in the period during which the current path ST3 is formed. The value of integral of the current IL running in the second direction is proportional to the duration of the period in which the current path ST3 is held. Accordingly, the output voltage VMM that develops across the capacitor C2 as a result of the ratio of the period of making of the current path ST3 to the period T0 being increased or decreased can arbitrarily be increased or decreased. Therefore, the DC-DC converter 1100 of the present embodiment only requires one inductor and can generate positive and negative source voltages and arbitrarily control levels of the respective source voltages. In the DC-DC converter 1100 of the present embodiment, after the electric current IL running in the first direction has been caused to flow into the inductor L, the electric current IL running in the first direction is decreased to zero. Subsequently, the electric current IL running in the second direction opposite to the first direction is caused to flow into the inductor L, and the electric current IL running in the second direction is caused to flow into the inductor L. After the electric current IL running in the second direction has subsequently been decreased to zero, the electric current IL running in the first direction opposite to the second direction is caused to flow into the inductor L. Therefore, excessive noise does not arise in the inductor L, so that stable operation is performed.

Figure 8:
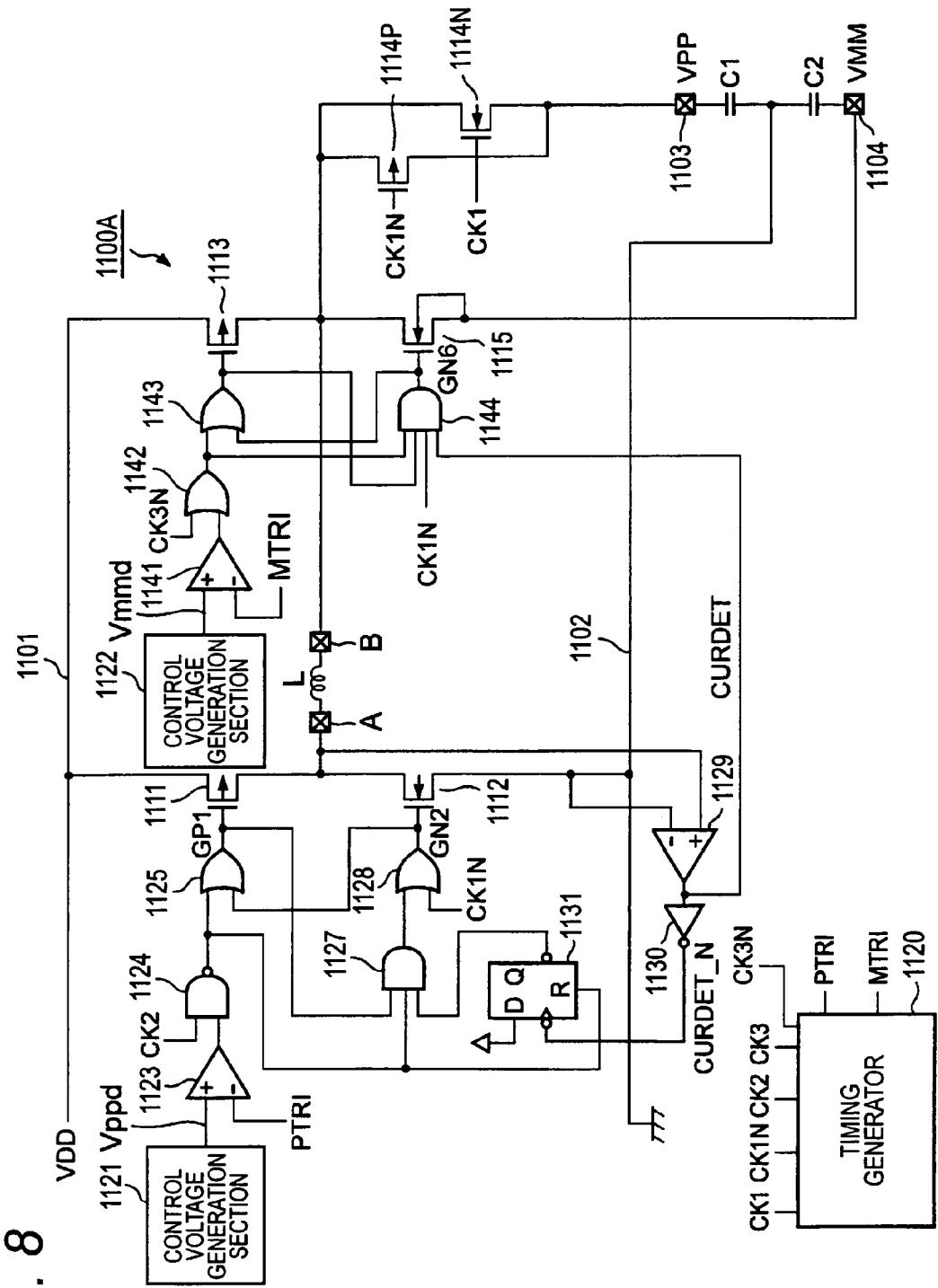
FIG. 8 is a circuit diagram showing a configuration of a DC-DC converter that is a specific example of a second DC-DC converter.
Figure 9:
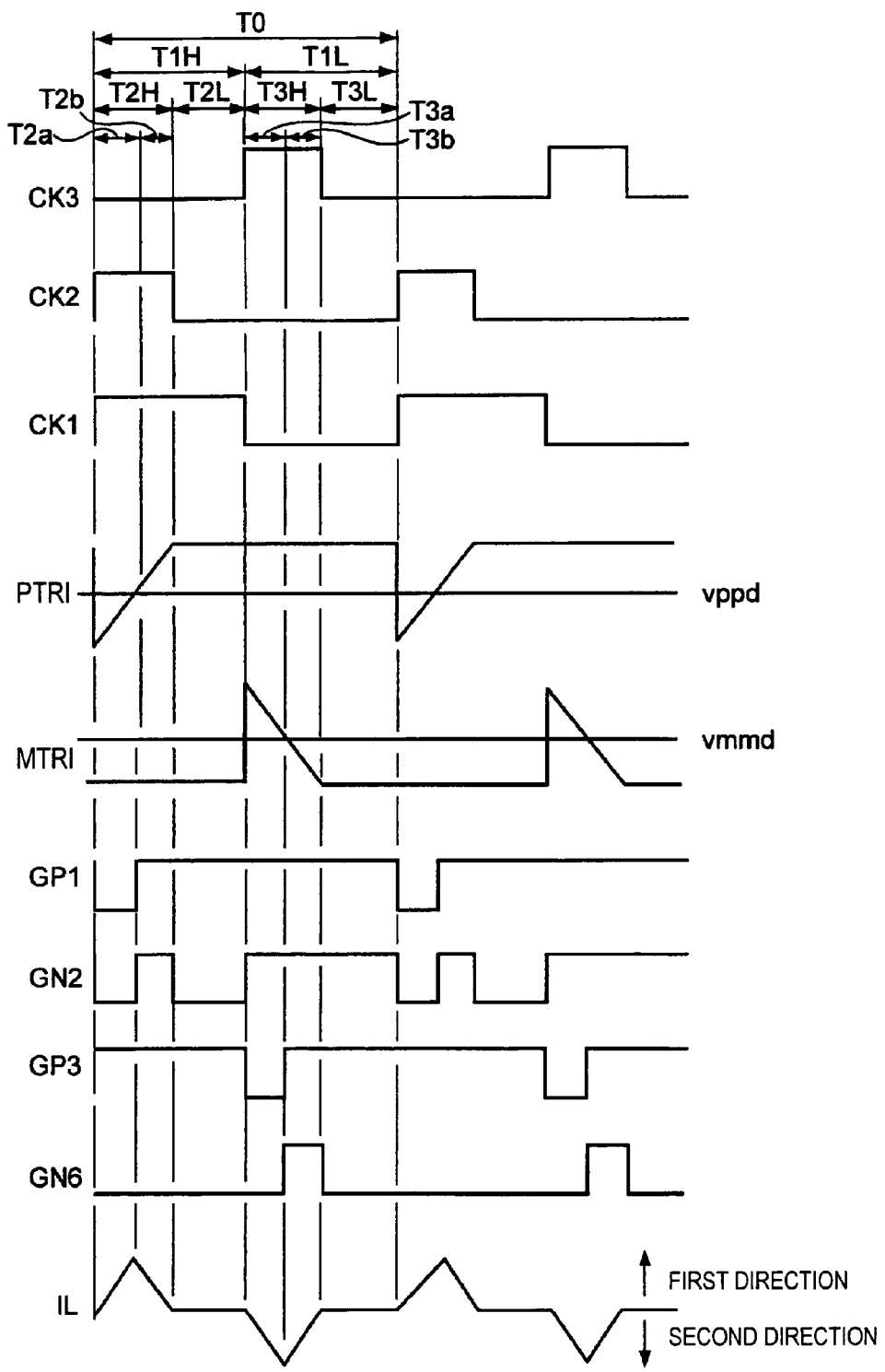
FIG. 9 is a timing chart showing operation of the DC-DC converter.
Figure 10:
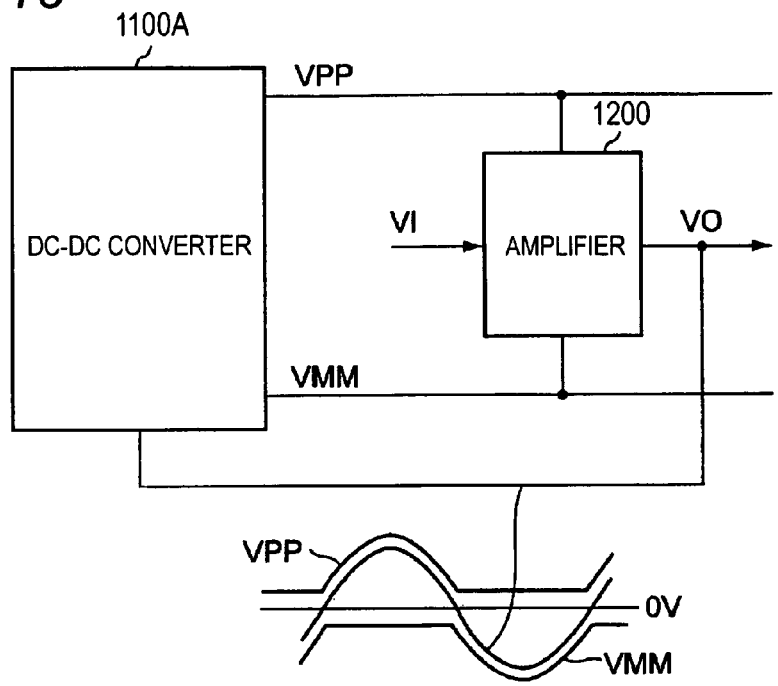
FIG. 10 is a block diagram showing example usage of the DC-DC converter.

FIG. 8 is a circuit diagram showing a configuration of a DC-DC converter 1100A that is a specific example of the DC-DC converter 1100 of this embodiment. FIG. 9 is a timing chart showing operation of the DC-DC converter 1100A. FIG. 10 is a block diagram showing example usage of the DC-DC converter 1100A.

In FIG. 8, sections corresponding to the respective sections shown in FIG. 6 are assigned the common reference numerals. In FIG. 8, the switch SW1 shown in FIG. 6 is configured by a P channel field effect transistor (hereinafter simply called a "P channel transistor") 1111. The switch SW2 shown in FIG. 6 is configured by an N channel field effect transistor (hereinafter simply called an "N channel transistor") 1112. The switch SW3 shown in FIG. 6 is configured by a P channel transistor 1113. The switch SW4 shown in FIG. 6 is configured by a CMOS transfer switch made up of a P channel transistor 1114P and an N channel transistor 1114N. The switch SW5 shown in FIG. 6 is configured by an N channel transistor 1115.

A configuration of a part corresponding to the control section 1010 shown in FIG. 6 is now described. A timing generator 1120 is a circuit that generates clock signals CK1, CK1N, CK2, CK3, CK3N and triangular waveform signals PTRI and MTRI. As shown in FIG. 9, the clock signal CK1 is a clock signal that appears a HIGH level in a first half period T1H of one period T0 and a LOW level in a latter half period T1L of the one period T0. The clock signal CK1N is a clock signal resultant of inversion of the clock signal CK1. As shown in FIG. 9, the clock signal CK2 is a clock signal that appears a HIGH level in a first half period T2H, which is one of two periods T2H and T2L generated by additional division of the first half period T1H of the one period T0, and a LOW level in the other period. As shown in FIG. 9, the clock signal CK3 is a clock signal that appears a HIGH level in a first half period T3H, which is one of two periods T3H and T3L generated by additional division of the latter half period T1L of the one period T0, and a LOW level in the other period. The clock signal CK3N is a clock signal resultant of inversion of the clock signal CK3. The triangular waveform signal PTRI is a signal that falls from the maximum level (e.g., a VDD) to the minimum level (e.g., −VDD) at a rising edge of the clock signal CK2; that linearly rises from the minimum level to the maximum level after consumption of a period for holding the clock signal CK2 on a HIGH level; and that subsequently sustains the maximum level up to the next rising edge of the clock signal CK2. The triangular waveform signal MTRI is a signal that rises from the minimum level to the maximum level at a rising edge of the clock signal CK3; that linearly falls from the maximum level to the minimum level after consumption of a period for holding the clock signal CK3 on a HIGH level; and that subsequently sustains the minimum level up to the next rising edge of the clock signal CK3.

A control voltage generation section 1121 is a circuit that generates a control voltage vppd used for controlling the output voltage VPP. A control voltage generation section 1122 is a circuit that generates a control voltage vmmd used for controlling the output voltage VMM. The following is a reason that the DC-DC converter 1100A is provided with the control voltage generation sections 1121 and 1122.

As shown in FIG. 10, in the specific example the DC-DC converter 1100A is used for supplying an amplifier 1200 with the positive source voltage VPP and the negative source voltage VMM. The amplifier 1200 amplifies an input signal VI and outputs a resultant signal as a signal VO. In order to minimize the electric power uselessly consumed by the amplifier 1200 at this time, the DC-DC converter 1100A controls the source voltages VPP and VMM in such a way that the amplifier 1200 is supplied with the source voltage VPP that is higher, by a predetermined level, than either the output signal VO of the amplifier 1200 or a 0V, whichever is higher, and that the amplifier 1200 is supplied with the source voltage VMM that is lower, by a predetermined level, than either the output signal VO of the amplifier 1200 or a 0V, whichever is lower. In order to perform control of the source voltages VPP and VMM, such as that mentioned above, in the DC-DC converter 1100A, the control voltage generation section 1121 generates a control voltage vppd that is higher, by a predetermined level, than either the output signal VO of the amplifier 1200 or 0V, whichever is higher; and the control voltage generation section 1122 generates a control voltage vmmd that is lower, by a predetermined level, than the output signal VO of the amplifier 1200 or 0V, whichever is lower. The DC-Dc converter 1100A controls the output voltage VPP in accordance with the control voltage vppd generated by the control voltage generation section 1121 and the output voltage VMM in accordance with the control voltage vmmd generated by the control voltage generation section 1122.

In FIG. 8, a comparator 1123 outputs a signal that appears a HIGH level in a period during which the control voltage vppd is higher than the triangular waveform signal PTRI and that appears a LOW level in the other period. A NAND gate 1124 outputs a signal that appears a LOW level in a period during which both the clock signal CK2 and an output signal from the comparator 1123 are on a HIGH level and that appears a HIGH level in a remaining period. An OR gate 1125 outputs, as a gate voltage GP1 for the P channel transistor 1111, a logical OR of a gate voltage GN2 for the N channel transistor 1112 and an output signal from the NAND gated 1124.

An AND gate 1127 outputs to an OR gate 1128 a signal showing a logical product of the gate voltage GP1 for the P channel transistor 1111, an output signal from the NAND gate 1124, and a negative logic output signal from a flip-flop circuit 1131. The OR gate 1128 outputs, as the gate voltage GN2 for the N channel transistor 1112, a logical OR product of the clock signal CK1N and an output signal from the AND gate 1127. A comparator 1129 outputs a signal CURDET that appears a HIGH level in a period during which a level of the terminal A is higher than the level of the reference power line 1102 and that appears a LOW level in the other period. An inverter 1130 inverts the signal CURDET and outputs a signal CURDET_N. A data input terminal D of a flip-flop circuit 1131 is fixed to a HIGH level. The signal CURDET_N is applied to a clock terminal of the flip-flop circuit 1131, and the output signal from the NAND gate 1124 is applied to a reset terminal R. A negative logical output signal from the flip-flop circuit 1131 is applied to the AND gate 1127.

A comparator 1141 outputs a signal that appears a LOW level in a period during which the control voltage vmmd is lower than the triangular waveform signal MTRI and that appears a HIGH level in the other period. An OR gate 1142 outputs a signal that appears a LOW level in a period during which both the clock signal CK3N and an output signal from the comparator 1141 are on a LOW level and that appears a HIGH level in the other period. An OR gate 1143 outputs, as a gate voltage GP3 for the P channel transistor 1113, a logical OR product of a gate voltage GN6 for the N channel transistor 1115 and an output signal from the OR gate 1142. An AND gate 1144 outputs, as the gate voltage GN6 for the N channel transistor 1115, a logical product of the output signal from the OR gate 1142, the gate voltage GP3 for the P channel transistor 1113, the clock signal CK1N, and the signal CURDET. The clock signal CK1N is applied to a gate of the P channel transistor 1114P, and the clock signal CK1 is applied to a gate of the N channel transistor 1114N.

The above relates to a configuration of the DC-DC converter 1100A.

Operation of the DC-DC converter 1100A is now described by reference to FIG. 9. Since the clock signal CK1 appears a HIGH level and the clock signal CK1N appears a LOW level in the first half period T1H of the period T0, the P channel transistor 1114P and the N channel transistor 1114N are turned on. Further, since the clock signal CK1N appears a LOW level, the gate voltage GN6 for the N channel transistor 1115 appears an LOW level, so that the N channel transistor 1115 is turned off. Moreover, since the clock signal CK3 appears a LOW level and the clock signal CK3N appears a HIGH level in the period T1H, the gate voltage GP3 for the P channel transistor 1113 appears a HIGH level, so that the P channel transistor 1113 is turned off.

When the clock signal CK2 rises at a starting point of the period T1H, the triangular waveform signal PTRI concurrently falls to the minimum level and then gradually rises toward the maximum level. In a period during which the control voltage vppd is higher than the triangular waveform signal PTRI, the output signal from the comparator 1123 appears a HIGH level, and the output signal from the NAND gate 1124 appears a LOW level. When the output signal from the NAND gate 1124 appears a LOW level, an output signal from the AND gate 1127 appears a LOW level. Since the clock signal CK1N is on a LOW level at this time, the gate voltage GN2 for the N channel transistor 1112 appears a LOW level, whereby the N channel transistor 1112 is turned off. The output signal from the NAND gate 1124 appears a LOW level, and the gate voltage GN2 for the N channel transistor 1112 appears a LOW level. Therefore, the gate voltage GP1 for the P channel transistor 1111 appears a LOW level, whereupon the P channel transistor 1111 is turned on.

As a result of the P channel transistor 1111 being turned on as mentioned above, the previously described current path ST1 is formed, and the electric current flows into the inductor L in the first direction, thereby charging the capacitor C1. In a period T2a during which the control voltage vppd is higher than the triangular waveform signal PTRI, the output signal from the comparator 1123 appears a HIGH level, and the output signal from the NAND gate 1124 appears a LOW level. Thus, the gate voltage GP1 for the P channel transistor 1111 sustains the LOW level, so that application of an electric current to the inductor L by way of the current path ST1 and recharge of the capacitor C1 are continually performed. In the meantime, the electric current IL flowing into the inductor L in the first direction gradually increases.

In the period T2H during which the clock signal CK2 is held on the HIGH level, when the triangular waveform signal PTRI exceeds the control voltage vppd, the output signal from the comparator 1123 appears a LOW level, so that the output signal from the NAND gate 1124 appears a HIGH level. As a consequence, the gate voltage GP1 for the P channel transistor 1111 appears a HIGH level, whereby the P channel transistor 1111 is turned off. Further, the flip-flop circuit 1131 is reset by a rising edge of the output signal from the NAND gate 1124, so that the negative logic output signal from the flip-flop circuit 1131 appears a HIGH level. As a consequence, the output signal from the AND gate 1127 appears a HIGH level, and the gate voltage GN2 for the N channel transistor 1112 appears a HIGH level. Thus, the N channel transistor 1112 is turned on.

As a result of the N channel transistor 1112 being turned on as mentioned above, the previously described current path ST2 is formed, so that the electric current flows into the inductor L in the first direction, to thus charge the capacitor C1. In a period during which the current path ST2 remains formed, the inductor L discharges the electric energy stored in the time during which the current path ST1 was formed, and hence the electric current IL flowing into the inductor L in the first direction gradually decreases.

In a period during which the electric current IL flows into the inductor L in the first direction, an electric current equal to the electric current IL flows from a source to a drain of the N channel transistor 1112 (or from the reference power line 1102 to the terminal A). As the electric current IL gradually decreases, the voltage between the source and the drain of the N channel transistor 1112 also decreases. When the electric current IL comes to zero and when overshoot in which the electric potential of the terminal A rises to a level higher than the level of the reference power line 1102 occurs, the output signal CURDET from the comparator 1129 appears a HIGH level, and the signal CURDET_N applied to the clock terminal of the flip-flop circuit 1131 falls. As a consequence, the HIGH level applied to the data terminal D is written into the flip-flop circuit 1131, whereby the negative logic output signal from the flip-flop circuit 1131 appears a LOW level. Consequently, the signal output from the AND gate 1127 appears a LOW level, and the gate voltage GN2 for the N channel transistor 1112 appears a LOW level, so that the N channel transistor 1112 is turned off. The current path ST2 is thereby opened.

The current path ST2 is held, as mentioned above, only in a period during which the electric current IL running in the first direction assumes a value of zero or more. The duration of the period during which the current path ST2 is held is dependent on the magnitude of the electric energy stored in the inductor L during formation of the current path ST1. The duration during which the current path ST2 is maintained may end shorter than a remaining period T2b determined by subtracting the period T2a during which the current path ST1 is held from a period T2H during which the clock signal CK2 is held on the HIGH level. Alternatively, the duration during which the current path ST2 is maintained may also become longer than the period T2b. When the current path ST2 is opened, the DC-DC converter 1100A enters a state in which none of the current paths ST1 to ST4 is formed.

In the latter half period T1L of the period T0, the clock signal CK1 appears a LOW level, and the clock signal CK1N appears a HIGH level. Therefore, the P channel transistor 1114P and the N channel transistor 1114N are turned off. Moreover, in the period T1L, the clock signal CK2 appears a LOW level. For this reason, the gate voltage GP1 for the P channel transistor 1111 appears a HIGH level, and the P channel transistor 1111 is turned off. Further, since the clock signal CK1N appears a HIGH level, the gate voltage GN2 for the N channel transistor 1112 appears a HIGH level, so that the N channel transistor 1112 is turned on.

When the clock signal CK3 rises at a starting point of the period T1L, the triangular waveform signal MTRI concurrently rises to the maximum level and subsequently, gradually decreases toward the minimum level. In a period during which the control voltage vmmd is lower than the triangular waveform signal MTRI, the output signal from the comparator 1141 appears a LOW level. Since the clock signal CK3N stays on the LOW level at this time, an output signal from the OR gate 1142 appears a LOW level, and the gate voltage GN6 output to the N channel transistor 1115 from the AND gate 1144 appears a LOW level. As a consequence, the gate voltage GP3 for the P channel transistor 1113 appears a LOW level, and the P channel transistor 1113 is turned on.

As a result of the P channel transistor 1113 being turned on as mentioned above, the previously described current path ST3 is formed, and an electric current flows into the inductor L in the second direction. In a period T3a during which the control voltage vmmd is lower than the triangular waveform signal MTRI, the output signal from the comparator 1141 is held on the LOW level, so that the gate voltage GP3 for the P channel transistor 1113 is maintained on the LOW level. Therefore, application of the electric current to the inductor L by way of the current path ST3 is continually maintained. During the period, the electric current IL flowing into the inductor L in the second direction gradually increases.

When the triangular waveform signal MTRI becomes lower than the control voltage vmmd in the period T3H during which the clock signal CK3 holds the HIGH level, the output signal from the comparator 1141 appears a HIGH level, and the output signal from the OR gate 1142 appears a HIGH level. As a consequence, the gate voltage GP3 for the P channel transistor 1113 appears a HIGH level, and the P channel transistor 1113 is turned off. Further, since the electric current IL originating from the inductor L is flowing into the N channel transistor 1112 at this time, an electric potential of the terminal A is higher than an electric potential of the reference power line 1102, and the output signal CURDET from the comparator 1129 has already attained the HIGH level. Therefore, the gate voltage GN6 output to the N channel transistor 1115 from the AND gate 1114 appears a HIGH level, and the N channel transistor 1115 is turned on.

As a result of the N channel transistor 1115 being turned on as mentioned above, the previously described current path ST4 is formed, and the electric current flows into the inductor L in the second direction, thereby charging the capacitor C2. In the period during which the current path ST4 remains formed, the inductor L discharges the electric energy stored during formation of the current path ST3; therefore, the electric current IL flowing into the inductor L in the second direction gradually decreases.

In the period during which the electric current IL is flowing into the inductor L in the second direction, an electric current equal to the electric current IL flows from the drain to the source of the N channel transistor 1112 (or from the terminal A to the reference power line 1102). As the electric current IL decreases, the voltage developing between the source and the drain of the N channel transistor 1112 also decreases. When the electric current IL has come to zero and when undershoot in which the electric potential of the terminal A becomes lower than the level of the reference power line 1102 has occurred, the output signal CURDET from the comparator 1129 appears a LOW level. As a consequence, the gate voltage GN6 output to the N channel transistor 1115 from the AND gate 1114 appears a LOW level, whereupon the N channel transistor 1115 is turned off. The electric current ST4 is thereby opened.

As mentioned above, the current path ST4 is maintained in only a period during which the electric current IL running in the second directions assumes a value of 0 or more. The duration of the period during which the current path ST4 is maintained is dependent on the magnitude of the electric energy stored in the inductor L during formation of the current path ST3. The duration during which the current path ST4 is maintained may end shorter than a remaining period T3b determined by subtracting the period T3a during which the current path ST3 is held from the period T3H during which the clock signal CK3 is held on the HIGH level. Alternatively, the duration during which the current path ST4 is maintained may also become longer than the period T3b. When the current path ST4 is opened, the DC-DC converter 1100A enters a state in which none of the current paths ST1 to ST4 is formed.

Above operation is iterated every T0 periods.

In the above described DC-DC converter 1100A, the control voltage vppd rises according to a rise in signal VO in a period during which the amplifier 1200 outputs a positive polarity signal VO. The period T2a during which the current path ST1 is formed becomes longer, and the source voltage VPP for the amplifier 1200 becomes greater in a positive direction. In contrast, in the period during which the amplifier 1200 outputs a negative polarity signal VO, the control voltage vmmd decreases in accordance with the decrease in signal VO, and the period T3a during which the current path ST3 is formed becomes longer, and the source voltage VMM for the amplifier 1200 becomes longer in the negative direction. Accordingly, the source voltages VPP and VMM optimum for an amplitude of the output signal VO from the amplifier 1200 can be supplied to the amplifier 1200, and power wastefully consumed by the amplifier 1200 can be diminished. Further, the current path ST2 is opened when the electric current IL flowing into the inductor L in the first direction comes to zero during formation of the current path ST2 in the DC-DC converter 1100A, the current path ST4 is opened during formation of the current path ST4 when the electric current IL flowing into the inductor L in the second direction has come to zero. Hence, the capacitor C1 is transferred without impairing the electric energy stored in the inductor L during formation of the current path ST1. The electric energy stored in the inductor L during formation of the current path ST3 can be transferred to the capacitor C2 without impairment. Accordingly, the source voltages VPP and VMM can be controlled with superior accuracy.

Other Embodiments

Although the second embodiment has been described above, other embodiments of the present invention; for instance, are also conceivable as follows.

(1) In the second embodiment, the DC-DC converter is provided with an external inductor L, but an inductor L can also be incorporated in the DC-DC converter. Moreover, the capacitors C1 and C2 can also be incorporated in the DC-DC converter. Certainly, the DC-DC converter can be provided with external capacitors.

(2) In the second embodiment, there are alternately performed operation for sequentially forming the current paths ST1 and ST2, to thus generate the source voltage VPP across the capacitor C1, and operation for sequentially forming the current paths ST3 and ST4, to thus generate the source voltage VPP across the capacitor C2. However, it is also possible to perform only one of the two operations in one period, thereby producing only either the source voltage VPP or VMM.

(3) In the second embodiment, operation for sequentially forming the current paths ST1 and ST2, to thus generate the source voltage VPP across the capacitor c1, and operation for sequentially forming the current paths ST3 and ST4, to thus generate the source voltage VPP across the capacitor C2 are performed once in one period. However, time density during which former operation is performed and time density during which latter operation is performed may also be made different from each other according to a balance of level between the required source voltages VPP and VMM.

Figure 11:
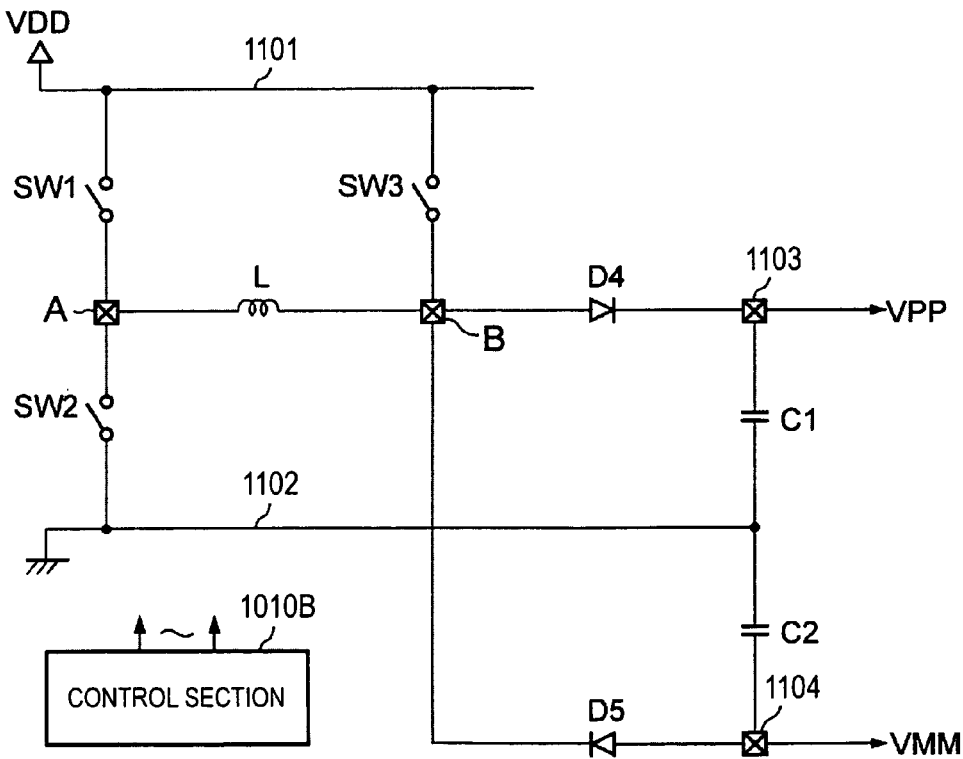
FIG. 11 is a circuit diagram showing a configuration of a first modification of the second embodiment.

(4) As shown in FIG. 11, the switch SW4 in the second embodiment (FIG. 6) can also be replaced with a diode D4, and the switch SW5 can also be replaced with a diode D5. In this case, a control bock 10B controls activation/deactivation of the switches SW1 to SW3. A mode of control operation is analogous to the mode of control operation of the control section 1010 of the second embodiment. The mode of control operation entails occurrence of an error, which is equivalent to a forward voltage of the diodes D4 and D5, in the source voltages VPP and VMM; however, the mode of control operation yields an advantage of a simple configuration.

Figure 12:
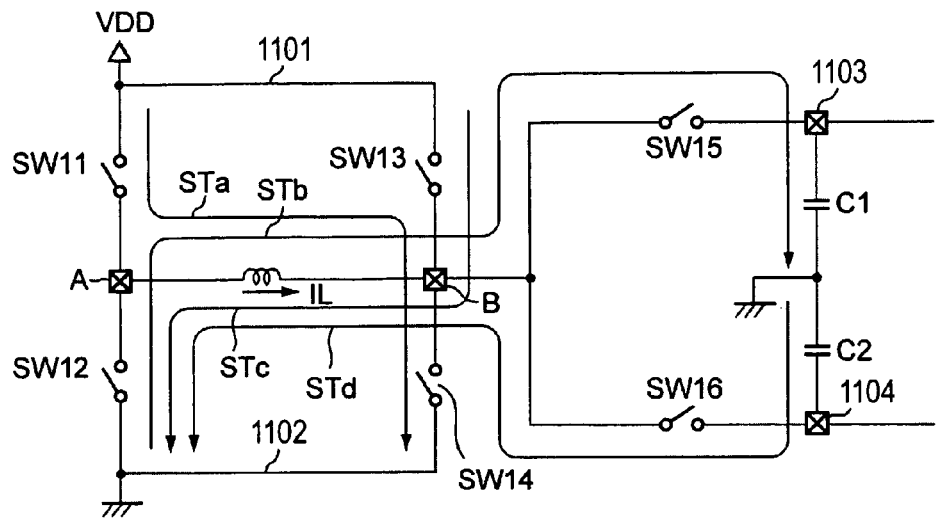
FIG. 12 is a circuit diagram showing a configuration of a second modification of the second embodiment.

(5) A configuration shown in FIG. 12 is also conceivable as another example modification of the second embodiment. In the present mode, a switch SW11 is interposed between the input power line 1101 and the terminal A. A switch SW12 is interposed between the reference power line 1102 and the terminal A. A switch SW13 is interposed between the input power line 1101 and the terminal B. A switch SW14 is interposed between the reference power line 1102 and the terminal B. A switch SW15 is interposed between the terminal B and the terminal 1103. A switch SW16 is interposed between the terminal B and the terminal 1104. An unillustrated control section generates a control signal for forming any desired one of illustrated current paths STa, STb, STc, and STd. The first current path STa is a current path that connects the input power line 1101 to the reference power line 1102 by way of the inductor L, thereby letting the electric current running from the terminal A to the terminal B in the first direction flow into the inductor L. The second current path STb is a looped current path in which the inductor L and the capacitor C1 are interposed in series. The third current path STc is a current path that connects the input power line 1101 to the reference power line 1102 by way of the inductor L, thereby letting the electric current, which runs in the second direction opposite to the first direction, flow into the inductor L. The fourth current path STd is a looped current path in which the inductor L and the capacitor C2 are interposed in series. The modification differs from the second embodiment (FIG. 6) in that the first current path STa does not pass through the capacitor C1.

Figure 13:
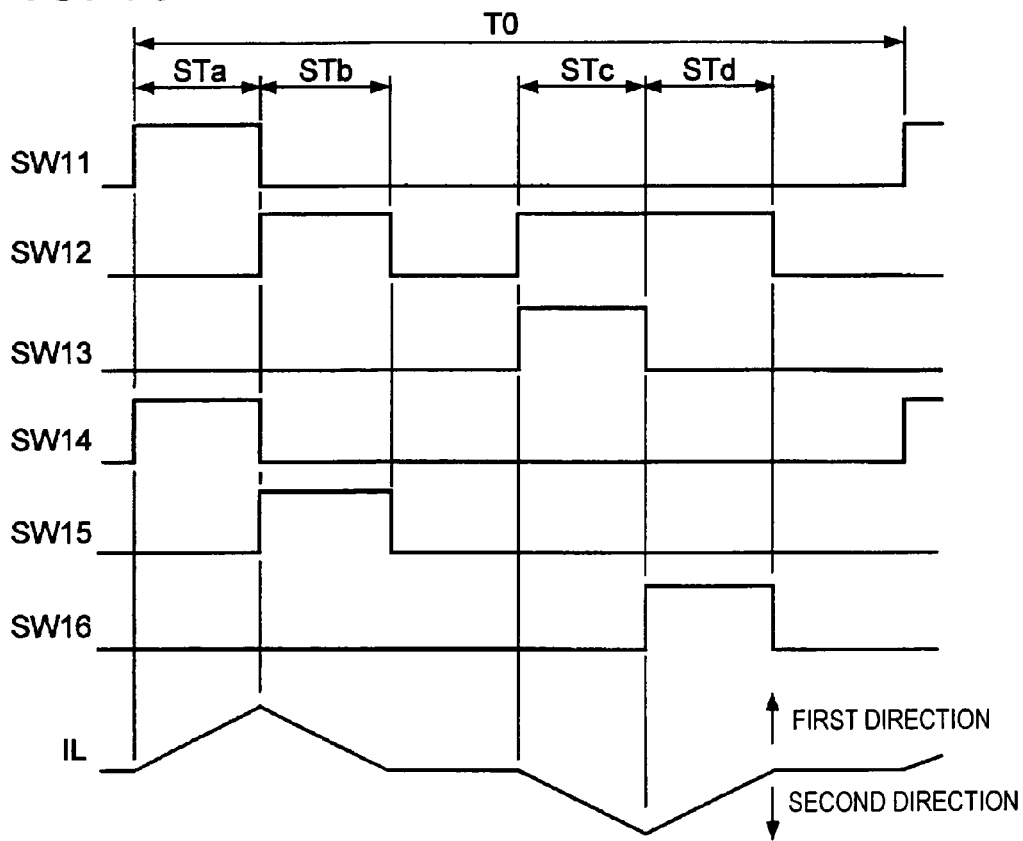
FIG. 13 is a timing chart showing operation of the second modification of the second embodiment.

FIG. 13 is a timing chart showing example operation of the DC-DC converter shown FIG. 12. The timing chart explicitly shows respective periods during which the current paths STa, STb, STc, and STd are formed. As shown in FIG. 13, the DC-DC converter iterates, every periods T0 that each have a given time length, operation for sequentially forming the current paths STa, STb, STc, and STd. To be more specific, the unillustrated control section outputs, at a switching point in the period T0, a control signal that continually activates the switches SW11 and SW14 and deactivates the other switches for a given time, thereby forming the current path STa. During the period, the electric current IL that increases at a gradient proportional to the source voltage VDD flows into the inductor L in the first direction. Next, the control section outputs a control signal that continually activates the switches SW12 and SW15 and deactivates the other switches for a given time, thereby forming the current path STb. During the period, the capacitor C1 is charged with, by way of the current path STb, the electric current IL that flows into the inductor L in the first direction. During the period, the electric current IL gradually decreases, to thus come to zero.

After opening of the current path STb, any of the current paths STa to STd is not formed until the first half of the period T0 ends. When the latter half of the period T0 begins, a control signal that continually activates the switches SW12 and SW13 and deactivates the other switches for a given period is output, thereby forming the current path STc. During the period, the electric current IL that increases at a gradient proportional to the source voltage VDD in the second direction flows into the inductor L. Next, a control signal that continually activates the switches SW12 and SW16 and deactivates the other switches for a given period is output, thereby forming the current path STd. During the period, the capacitor C2 is charged with, by way of the current path STd, the electric current IL that flows into the inductor L in the second direction. The electric current IL gradually decreases during the period, to thus come to zero. After opening of the current path ST2, any of the current paths ST1 to ST4 is not formed until the period T0 is switched to a new period T0. The above is operation of the DC-DC converter shown in FIG. 12 for one period.

Even in the mode, an advantage analogous to that described in connection with the embodiment is yielded. In the mode, the current path STc does not pass through the capacitor, nor does the current path STa. Accordingly, the electric energy stored in the inductor L can be made accurately proportional to the time during which the current path STa is formed. Therefore, there is yielded an advantage of easy control of the source voltage VPP.

(6) In the specific example shown in FIG. 8, the length of the period T2$a$ during which the current path ST1 is formed and the length of the period T3$a$ during which the current path ST3 is formed are controlled in accordance with a signal (the output signal VO from the amplifier 1200) applied from the outside. However, it is also possible to control only one of the two lengths and fix the other length.

Next, a third embodiment of the present invention is now described.

(A: a Configuration)

Figure 14:
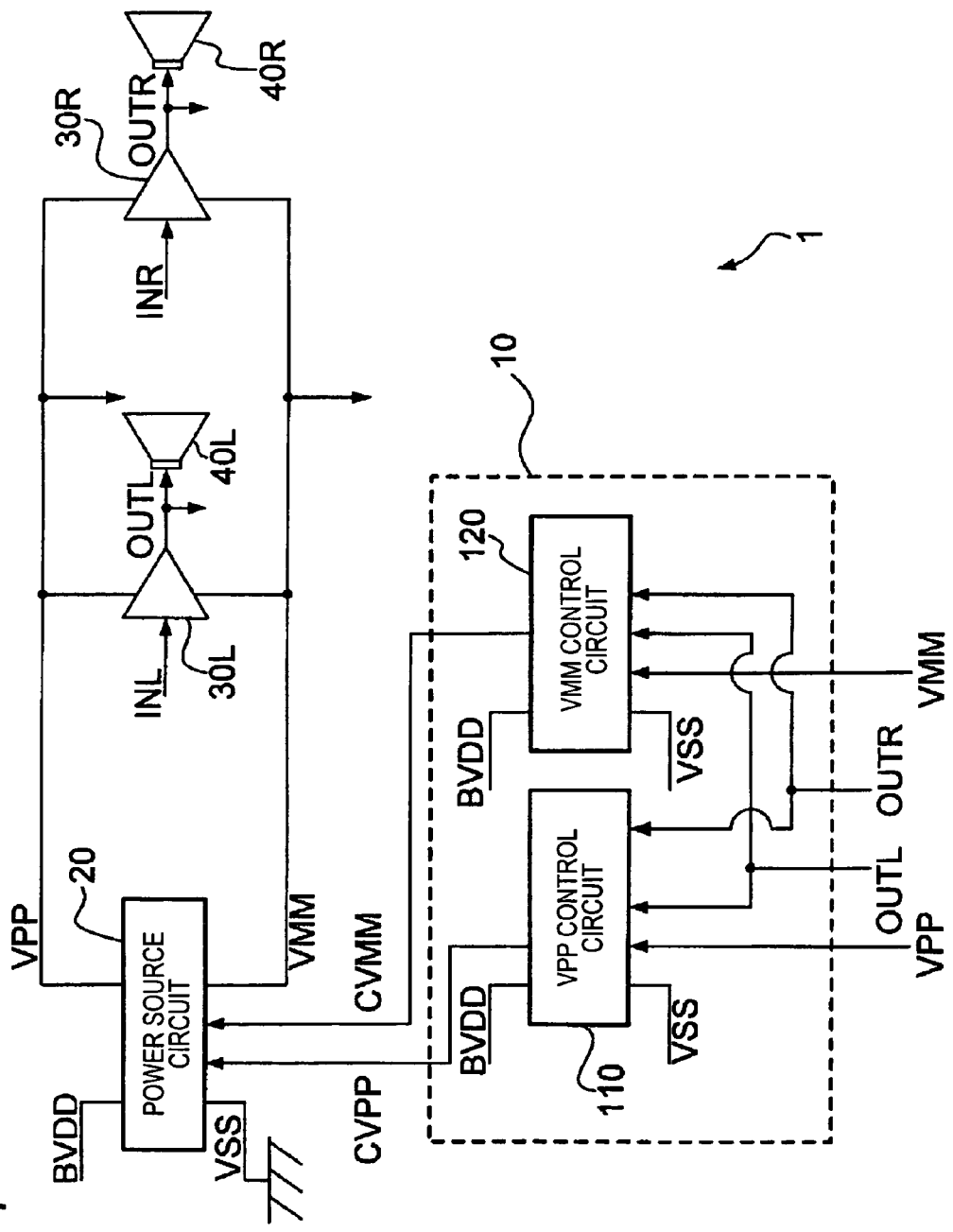
FIG. 14 is a block diagram showing an example configuration of a speaker system that includes an output voltage control circuit that is a third embodiment of the present invention.

FIG. 14 is a block diagram showing an example configuration of a speaker system 1 including an output voltage control circuit 10 of a third embodiment of the present invention. The Speaker System 1 is Built into; for instance, a mobile phone and a portable game terminal, and plays back sound under control of an unillustrated host CPU. As shown in FIG. 14, the speaker system 1 includes a left channel speaker 40L and a right channel speaker 40R; an amplifier 30L for activating the left channel speaker 40L and an amplifier 30R for activating the right channel speaker 40R; a power source circuit 20 for supplying an operating voltage to the amplifiers; and the output voltage control circuit 10 for controlling an output from the power source circuit 20. When there is no necessity for distinguishing the speaker 40L and the speaker 40R from each other, they are described simply as speakers 40. Further, when there is no necessity for distinguishing the amplifier 30L and the amplifier 30R from each other, they are described simply as amplifiers 30.

The power source circuit 20 is; for instance, a charge pump, and configured so as to be able to switch an output voltage. The power source circuit 20 is connected to a first external power source (omitted from FIG. 14) that outputs a positive voltage BVDD (e.g., 1.8[V]) and a second external power source (that is a ground in the embodiment which is omitted from FIG. 14) that outputs a voltage VSS (e.g., 0[V]). Under control of the output voltage control circuit 10, the power source circuit 20 generates the high level output voltage VPP and the low level output voltage VMM. In the embodiment, a voltage difference between the voltages VPP and VMM serves as an operating voltage of the amplifiers 30.

The amplifiers 30 receive the high level output voltage VPP and the low level output voltage VMM from the power source circuit 20 and amplifies an input audio signal by taking a difference between the voltages as an operating voltage, and outputs an output audio signal, which is a result of amplification, to the speakers 40. As shown in FIG. 14, the amplifier 30R amplifies a right channel input audio signal INR, thereby producing and outputting an output signal OUTR for activating the speaker 40R. The amplifier 30L amplifies a left channel input audio signal INL, thereby producing and outputting an output signal OUTL for activating the speaker 40L. The output signals OUTL and OUTR are applied to the output voltage control circuit 10 as well as to the speakers 40L and 40R.

Figure 15A:
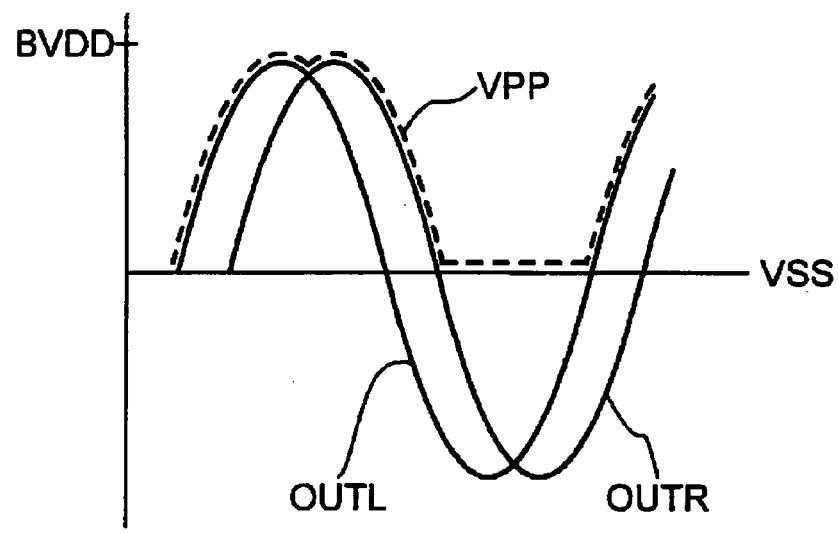
FIGS. 15A and 15B are views showing example output control performed by the output voltage control circuit of the third embodiment.
Figure 15B:
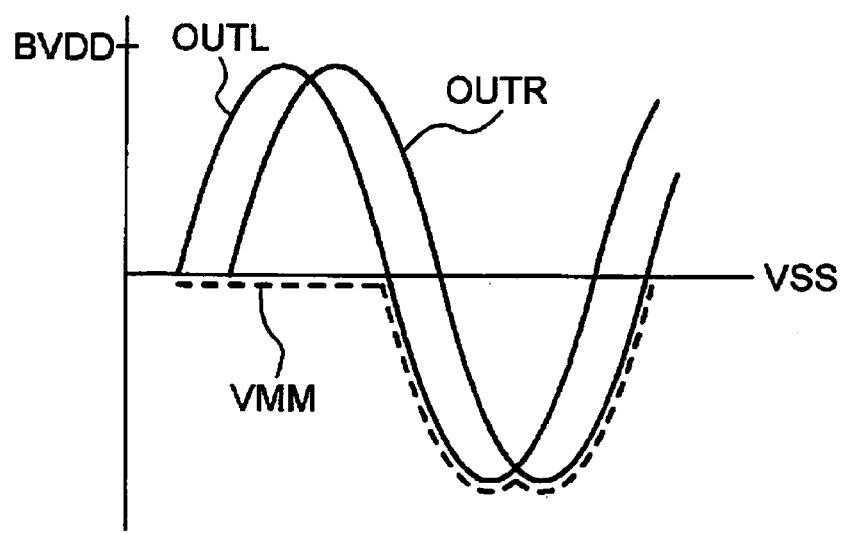

As shown in FIGS. 15A and 15B, each of the signals OUTL and OUTR is a signal whose voltage value fluctuates around the voltage VSS. As shown in FIG. 15A, the output voltage control circuit 10 performs control operation for causing the high level output voltage VPP to arise in the power source circuit 20 so as to follow the maximum one among the output signal OUTL from the amplifier 30L, the output signal OUTR from the amplifier 30R, and the voltage VSS, whereby the high level output voltage VPP turns into a voltage that fluctuates between the voltage BVDD and the voltage VSS (e.g., fluctuates within a range; for instance, 1.8 to 0.2[V]). As shown in FIG. 15B, the output voltage control circuit 10 also performs control operation for causing the power source circuit 20 to arise in the low level output voltage VMM so as to follow the minimum one of the output signal OUTL, the output signal OUTR, and the voltage VSS, whereby the low level output voltage VMM turns into a voltage that fluctuates (fluctuates in a range; for instance, −0.2 to −1.8[V]) between the voltage VSS and; for instance, a voltage (hereinafter described as a voltage BVSS) that is acquired when a polarity of the voltage BVDD is inverted.

As shown in FIG. 14, the output voltage control circuit 10 includes a VPP control circuit 110 and a VMM control circuit 120. The VPP control circuit 110 is supplied with the voltages BVDD, VSS, VPP, OUTL, and OUTR. The VMM control circuit 120 is supplied with the voltages BVDD, VSS, VMM, OUTL, and OUTR. Although detailed descriptions will be provided later, the VPP control circuit 110 uses as an operating voltage a difference between the voltage BVDD and the voltage VSS. Further, the VMM control circuit 120 uses as an operating voltage a difference between the voltage BVDD and the voltage VMM. There is another conceivable combination of voltages as operating voltages for the VPP control circuit and the VMM control circuit; however, details of the combination are described in connection with Example Modification (1).

The VPP control circuit 110 generates a signal level control signal CVPP linked to a difference between the high level output voltage VPP of the power source circuit 20 and the largest one among the output signals OUTL and OUTR and the voltage VSS; and applies the thus-generated signal level control signal CVPP to the power source circuit 20. The power source circuit 20 performs processing for adjusting the voltage VPP in such a way that the signal level of the control signal CVPP becomes smaller, as does the power source circuit shown in FIGS. 23A to 23C. The voltage VPP thereby comes to follow the maximum one among the output signals OUTL and OUTR and the voltage VSS. In the meantime, the VMM control circuit 120 generates a signal level control signal CVMM linked to a difference between the voltage VMM and the minimum one among the output signals OUTL and OUTR and the voltage VSS and applies the thus-generated control signal CVMM to the power source circuit 20. The power source circuit 20 performs processing for adjusting the voltage VMM in such a way that the signal level of the control signal CVMM becomes smaller, whereby the voltage VMM follows the minimum one among the output signals OUTL and OUTR and the voltage VSS.

Figure 23A:
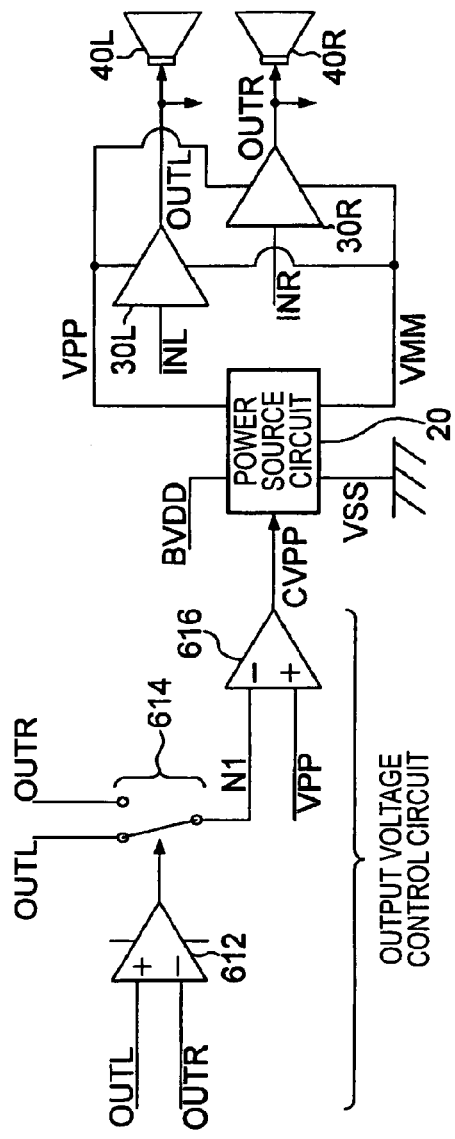
FIGS. 23A, 23B, and 23C are views showing an example configuration of a related output voltage control circuit.
Figure 23C:
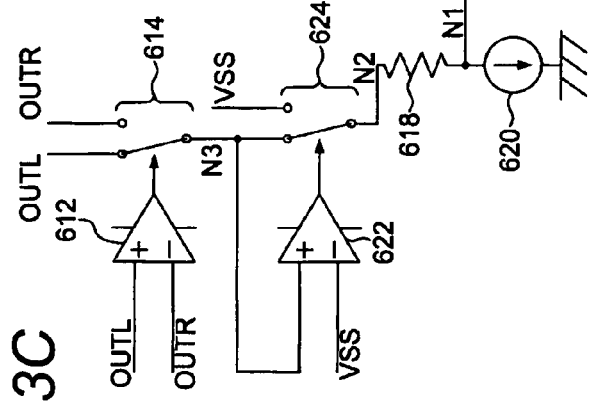
Figure 23B:
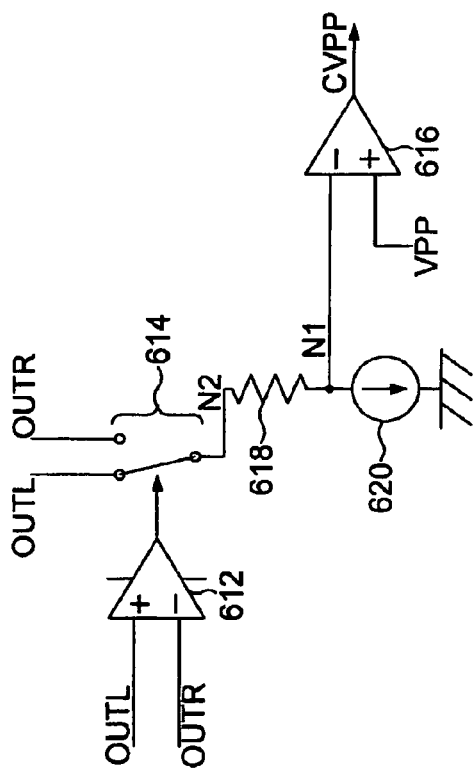

As shown in FIGS. 23A to 23C, the VPP control circuit 110 and the VMM control circuit 120 can hitherto, generally be configured by a combination of switches and comparators. However, the present embodiment is characterized in that the circuits are configured without use of the switches and comparators. Descriptions are provided primarily toward the VPP control circuit 110 and the VMM control circuit 120 that conspicuously shows the characteristic of the present embodiment.

Figure 16:
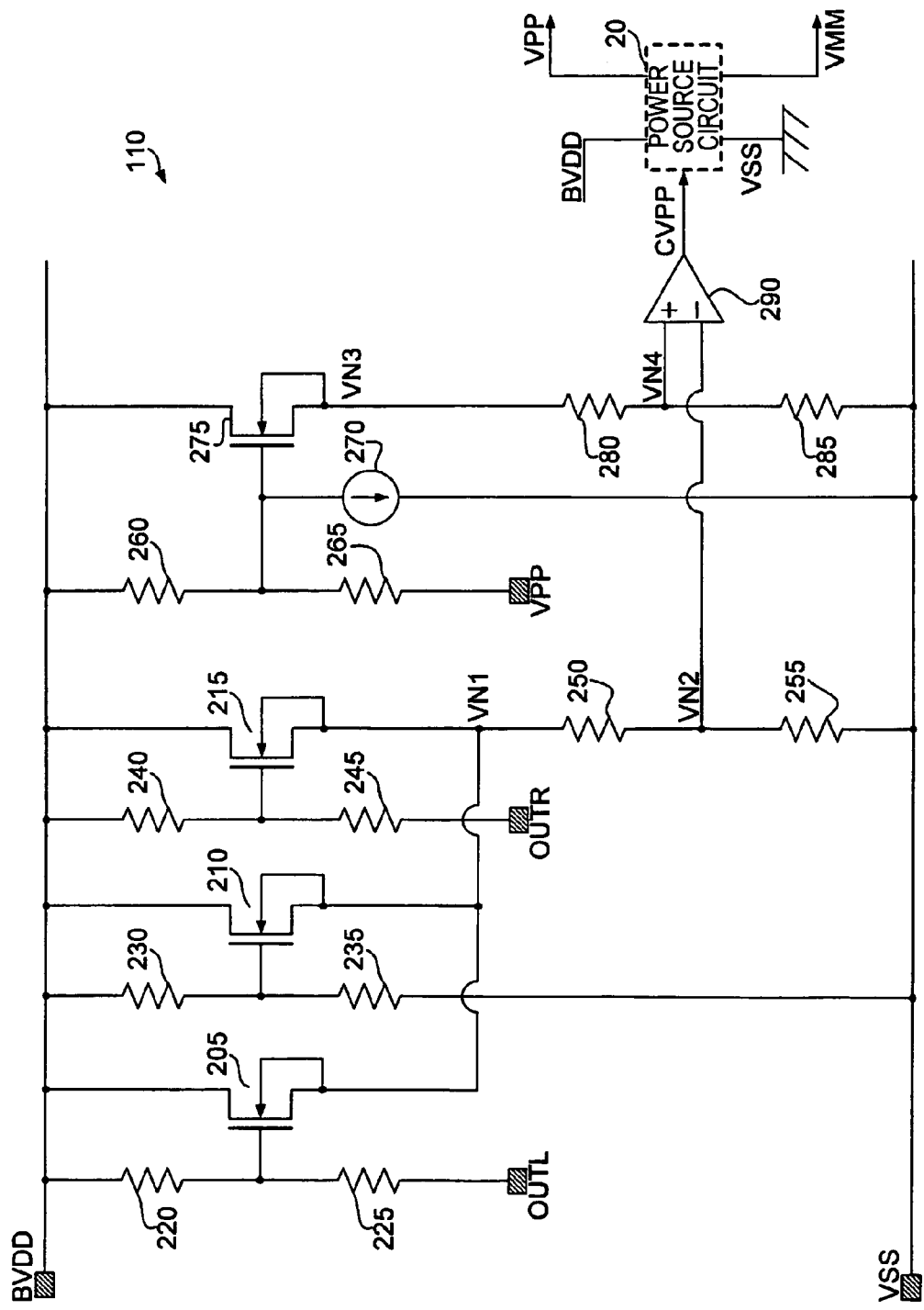
FIG. 16 is a block diagram showing an example configuration of a VPP control circuit of the output voltage control circuit of the third embodiment.

FIG. 16 is a view showing an example configuration of the VPP control circuit 110.

The VPP control circuit 110 includes four N channel field effect transistors (205, 210, 215, and 275), 12 resistors (220 to 265, 280, and 285), a constant current source 270, and an operational amplifier 290. Although detailed illustrations are omitted from FIG. 16, resistance values of the respective resistors 220, 230, 240, and 260 are Rx[Ω]; resistance values of the respective resistors 225, 235, 245, and 265 are Ry[Ω]; resistance values of the respective resistors 250 and 280 are Rz[Ω]; and resistance values of the respective resistors 255 and 285 are Rw[Ω]. Threshold voltages Vnth for the respective N channel field effect transistors 205, 210, 215, and 275 are a single voltage, and respective back gates of the four N channel field effect transistors are connected to their respective sources.

Respective drains of the N channel field effect transistors 205, 210, and 215 are connected to a terminal BVDD (a terminal where the voltage BVDD is input, and other terminals are also similarly identified by symbols of voltages input to the terminals), and respective sources of the transistors are commonly connected. The resistors 220 and 225 are interposed in series between the terminal BVDD and a terminal OUTL. A common node between the resistor 220 and the resistor 225 is connected to a gate of the N channel field effect transistor 205. Therefore, a voltage linked to the output signal OUTL from the amplifier 30L (a voltage obtained by dividing (boosting) the output signal OUTL by means of the resistors 220 and 225) is applied to the gate of the N channel field effect transistor 205.

The resistors 230 and 235 are interposed in series between the terminal BVDD and a terminal VSS. A common node between the resistor 230 and the resistor 235 is connected to a gate of the N channel field effect transistor 210. Therefore, a voltage linked to the voltage VSS (a voltage obtained by dividing (boosting) the voltage VSS by means of the resistors 230 and 235) is applied to the gate of the N channel field effect transistor 210. The resistors 240 and 245 are interposed in series between the terminal BVDD and a terminal OUTR. A common node between the resistor 240 and the resistor 245 is connected to a gate of the N channel field effect transistor 215. Therefore, a voltage linked to the output signal OUTR from the amplifier 30R (a voltage obtained by dividing (boosting) the output signal OUTR by means of the resistors 240 and 245) is applied to the gate of the N channel field effect transistor 215.

Drain voltages of the respective N channel field effect transistors 205, 210, and 215 shown in FIG. 16 are fixed to a constant value (the voltage BVDD), and back gates of the respective N channel field effect transistors are connected to their respective sources. Therefore, a voltage (a voltage that is lower than the voltage applied to the gate by an amount corresponding to the threshold voltage Vnth) linked to a voltage applied to each of the gates (i.e., a voltage obtained by dividing the output signal OUTL, the voltage VSS, and the output signal OUTR by means of a single voltage division ratio) appear at respective sources of the N channel field effect transistors 205, 210, and 215. Specifically, the three N channel field effect transistors act as drain-grounded amplifying circuits (source follower circuits). Although detailed descriptions are provided later, the three N channel field effect transistors in the VPP control circuit 110 of the embodiment work as a peak holding circuit.

The resistors 250 and 255 are interposed in series between the terminal VSS and the common node among the sources of the N channel field effect transistors 205, 210, and 215. A common node between the resistor 250 and the resistor 255 is connected to a negative input terminal of the operational amplifier 290. Therefore, the negative input terminal of the operational amplifier 290 is supplied with a voltage VN2 that is obtained as a result of a voltage VN1 appearing at the common node among the sources of the respective N channel field effect transistor 205, 210, and 215 being divided (lowered) by means of the resistor 250 and the resistor 255.

The resistors 260 and 265 are interposed in series between the terminal BVDD and a terminal VPP. The constant current source 270 is interposed between the terminal VSS and a common node between the resistors 260 and 265. The common node between the resistor 260 and the resistor 265 is connected to a gate of the N channel field effect transistor 275. A drain of the N channel field effect transistor 275 is connected the terminal BVDD, and a source of the same is connected to the terminal VSS by way of the resistors 280 and 285. Although detailed descriptions are provided later, the N channel field effect transistor 275 works, in conjunction with the operational amplifier 290, as a control signal generating section that generates the control signal CVPP for instructing control of the voltage VPP and outputs the thus-generated control signal CVPP to the power source circuit 20.

A positive input terminal of the operational amplifier 290 is connected to a common node between the resistor 280 and the resistor 285. Therefore, the positive input terminal of the operational amplifier 290 is supplied with a voltage VN4 that is obtained by dividing (lowering) a source voltage VN3 of the N channel field effect transistor 275 by means of the resistors 280 and 285. The operational amplifier 290 outputs to the power source circuit 20 the control signal CVPP whose signal level is linked to a voltage difference (i.e., VN4−VN2) between the voltage VN4 applied to the positive input terminal and the voltage VN2 applied to the negative input terminal.

The above is a configuration of the VPP control circuit 110.

Figure 17:
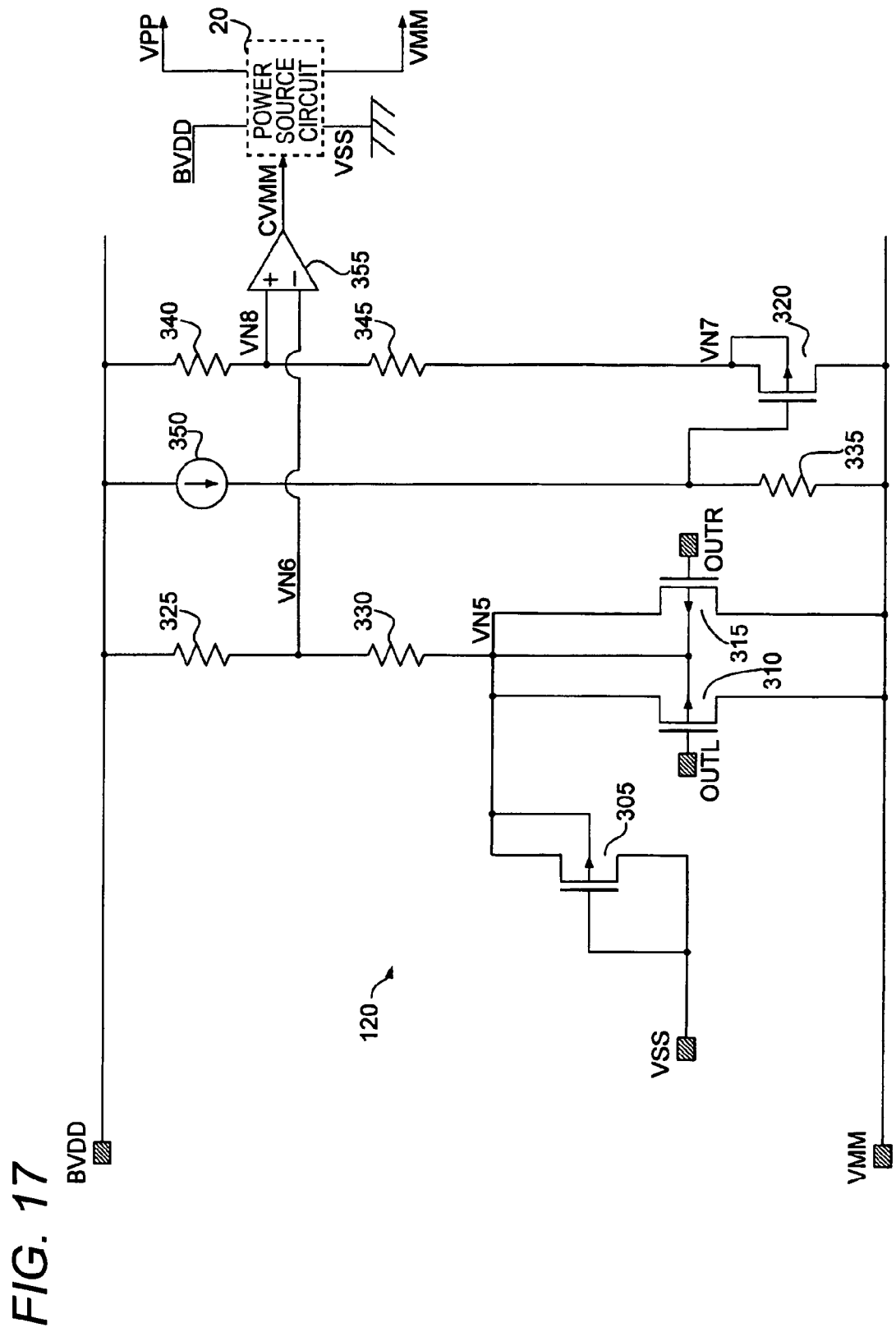
FIG. 17 is a block diagram showing an example configuration of a VMM control circuit of the output voltage control circuit of the third embodiment.

FIG. 17 is a view showing an example configuration of the VMM control circuit 120.

As shown in FIG. 17, the VMM control circuit 120 includes four P channel field effect transistors (305, 310, 315, and 320), five resistors (325, 330, 335, 340, and 345), a constant current source 350, and an operational amplifier 355. Although detailed illustrations are omitted from FIG. 17, resistance values of the respective resistors 325 and 340 are Ra [Ω]; resistance values of the respective resistors 330 and 345 are Rb [Ω]; and a resistance value of the resistor 335 is Rc[Ω]. Threshold voltages Vpth for the respective P channel field effect transistors 305, 310, 315, and 320 are a single voltage, and respective back gates of the four P channel field effect transistors are connected to their respective sources.

Respective sources of the P channel field effect transistors 305, 310, and 315 are commonly connected together. A drain and a gate of the P channel field effect transistor 305 are commonly connected to the terminal VSS, and a voltage that is higher than the voltage VSS by an amount corresponding to the threshold voltage Vpth appears at a source of the P channel field effect transistor 305. Respective drains of the P channel field effect transistors 310 and 315 are connected to a terminal VMM. A gate of the P channel field effect transistor 310 is connected to the terminal OUTL, and a gate of the P channel field effect transistor 315 is connected to the terminal OUTR. A voltage that is higher than the voltage applied to the respective gates by an amount corresponding to the threshold voltage Vpth appears at each of the sources of the P channel field effect transistors 310 and 315. Although detailed descriptions are provided later, the P channel field effect transistors 305, 310, and 315 act as a peak holding circuit in the VMM control circuit 120 of the present embodiment.

The resistor 325 and 330 are interposed in series between the terminal BVDD and a common node among the sources of the respective P channel field effect transistors 305, 310, and 315. A common node between the resistor 325 and the resistor 330 is connected to a negative input terminal of the operational amplifier 355. Consequently, when a voltage VN5 appears at the common node among the sources of the P channel field effect transistors 305, 310, and 315, a voltage VN6 that is obtained by dividing (boosting) the voltage VN5 by means of the resistors 325 and 330 is input to the negative input terminal of the operational amplifier 355.

A drain of the P channel field effect transistor 320 is connected to the terminal VMM, and a source of the same is connected to the terminal BVDD by way of the resistors 345 and 340. A common node between the resistors 345 and 340 is connected to a positive input terminal of the operational amplifier 355. The constant current source 350 and the resistor 335 are interposed in series between the terminal BVDD and the terminal VMM, and a common node between the constant current source 350 and the resistor 355 is connected to a gate of the P channel field effect transistor 320. Therefore, a voltage VN7 that is higher than a gate voltage (VMM+Rc×I) by an amount corresponding to the threshold voltage Vpth appears at a source of the P channel field effect transistor 320. A voltage VN8 that is obtained by dividing (boosting) the voltage VN7 by means of the resistors 340 and 345 is input to the positive input terminal of the operational amplifier 355. Therefore, the operational amplifier 355 outputs to the power source circuit 20 the control signal CVMM whose signal level is linked to a difference (VN8−VN6) between the voltage VN8 input to the positive input terminal and the voltage VN6 input to the negative input terminal. In the present embodiment, the power source circuit 20 performs processing for adjusting the low level output voltage VMM in such a way that the signal level of the control signal CVMM becomes smaller. Namely, the P channel field effect transistor 320 and the operational amplifier 355 in FIG. 17 act as a control signal generating section that generates and outputs a control signal CVMM for instructing control of the voltage VMM to the power source circuit 20.

The above is a configuration of the VMM control circuit 120.

(B: Operation)

Operation of the VPP control circuit 110 and the VMM control circuit 120 is now described.

(B-1: Operation of the VPP Control Circuit 110)

As mentioned previously, the N channel field effect transistors 205, 210, and 215 in the VPP control circuit 110 act respectively as drain-grounded amplifying circuits. A voltage that is lower than a voltage applied to the respective gates by an amount corresponding to the threshold voltage Vnth appears on each of the sources. For instance, when a voltage division ratio existing between the resistor 220 and the resistor 225, a voltage division ratio existing between the resistor 230 and the resistor 235, and a voltage division ratio existing between the resistor 240 and the resistor 245 are assumed to be r1, a voltage appearing at the source of the N channel field effect transistor 205 is r1×OUTL−Vnth; a voltage appearing at the source of the N channel field effect transistor 210 is r1×VSS−Vnth; and a voltage appearing at the source of the N channel field effect transistor 215 is r1×OUTR−Vnth.

Since sources of the N channel field effect transistors 205, 210, and 215 are commonly connected together, the voltage VN1 of the common node is dominated by the maximum one among the voltage VSS, the output signal OUTR, and the output signal OUTL. For instance, when a relationship of VSS<OUTR<OUTL stands, the source voltage of the N channel field effect transistor 210 and the source voltage of the N channel field effect transistor 215 gradually increase from their original value. As shown in FIG. 16, since the back gates of the three N channel field effect transistors are connected to their sources, a voltage between the gate and the back gate in each of the N channel field effect transistors 210 and 215 decreases as a result of an increase in the source voltage of the transistors. When the voltage between the gate and the back gate falls below the threshold voltage Vnth, the N channel field effect transistors are turned off. Therefore, if the output signal OUTL is the maximum among the voltage VSS, the output signal OUTR, and the output signal OUTL, the voltage VN1=r1×OUTL−Vnth is generated. Likewise, when the output signal OUTR is the maximum, VN1=r1×OUTR−Vnth is generated. When the voltage VSS is the maximum, VN1=r1×VSS−Vnth is generated. Thus, the voltage VN1 linked to the maximum voltage among the voltages applied to the respective gates appears in the common node among the sources of the N channel field effect transistors 205, 210, and 215. The three N channel field effect transistors act as a peak holding circuit.

The voltage VN2 obtained by dividing the voltage VN1 by means of the resistor 250 and the resistor 255 is input to the negative input terminal of the operational amplifier 290. When the voltage division ratio between the resistor 250 and the resistor 255 is assumed to be r2, the voltage VN2=r2×VN1 is generated. For instance, when a relationship of OUTR<VSS<OUTL stands, VN2=r2×(r1×OUTL−Vnth) is generated. In the meantime, the voltage VN4 obtained by dividing the source voltage VN3 of the N channel field effect transistor 275 by the resistors 280 and 285 is input to the positive input terminal of the operational amplifier 290. The N channel field effect transistor 275 acts as a drain-grounded amplifying circuit, and a voltage r1×VPP+ofset, which is obtained by dividing the voltage VPP by the resistors 260 and 265 and adding an offset voltage ofset from the constant current source 270 to a result of division, is input to a gate of the N channel field effect transistor 275. A back gate of the N channel field effect transistor 275 is also connected to its source, the source voltage VN3 comes to r1×VPP+ofset−Vnth. Therefore, VN4=r2×(r1×VPP+ofset−Vnth) is generated, and the operational amplifier 290 outputs the control signal CVPP linked to a difference between the voltage VN4 and the voltage VN2 (i.e., a difference between the voltage VPP and the maximum one among the output signal OUTL, the output signal OUTR, and the voltage VSS). As mentioned above, the VPP control circuit 110 of the present embodiment can generate and output the control signal CVPP linked to the difference between the voltage VPP and the maximum one among the output signal OUTL, the output signal OUTR, and the voltage VSS, without use of a comparator and a switch.

(B-2: Operation of the VMM Control Circuit 120)

Operation of the VMM control circuit 120 is now described. The voltage appearing on the source of the P channel field effect transistor 305 and the voltage appearing on the respective sources of the P channel field effect transistors 310 and 315 are first described. As mentioned previously, the drain and the gate of the P channel field effect transistor 305 are commonly connected to the terminal VSS, and the back gate of the P channel field effect transistor 305 is connected to its source. Consequently, when the P channel field effect transistor 305 is turned on, the voltage appearing on the source of the P channel field effect transistor comes to VSS+Vpth. In the meantime, a voltage generated by adding the threshold voltage Vpth to each of the gate voltages (OUTL or OUTR) of the P channel field effect transistors 310 and 315 appears on their respective sources.

Since the respective sources of the P channel field effect transistors 305, 310, and 315 are commonly connected together, the voltage VN5 appearing on the common node is dominated by the minimum one among the voltage VSS, the output signal OUTR, and the output signal OUTL. For instance, a relationship of VSS<OUTR<OUTL stands, the source voltage of the P channel field effect transistor 310 and the source voltage of the P channel field effect transistor 315 gradually fall from their original values. Since the back gate of each of the P channel field effect transistors shown in FIG. 17 is connected to its source, a voltage between the gate and the back gate in each of the P channel field effect transistors 310 and 315 increases as a result of a decrease in the source voltage of the transistors. When the voltage between the gate and the back gate exceeds the threshold voltage Vpth, the P channel field effect transistors are turned off. Therefore, if the voltage VSS is the minimum among the voltage VSS, the output signal OUTR, and the output signal OUTL, the voltage VN5=VSS+Vpth is generated. Likewise, when the output signal OUTR is the minimum, VN5=OUTR+Vpth is generated. When the output signal OUTL is the minimum, VN5=OUTL+Vpth is generated. Thus, the voltage VN5 linked to the minimum voltage among the voltages applied to the respective gates appears in the common node among the sources of the P channel field effect transistors 305, 310, and 315. The three P channel field effect transistors act as a peak holding circuit.

The voltage VN6 obtained by dividing the voltage VN5 by means of the resistor 325 and the resistor 330 is input to the negative input terminal of the operational amplifier 355. When the voltage division ratio between the resistor 325 and the resistor 330 is assumed to be r3, the voltage VN6=r3×VN5 is generated. For instance, when a relationship of VSS<OUTR<OUTL stands, VN6=r3×(VSS−Vpth) is generated. In the meantime, the voltage VN8 obtained by dividing the source voltage VN7 of the P channel field effect transistor 320 by the resistors 340 and 345 is input to the positive input terminal of the operational amplifier 355. A voltage (VMM+ofset) which is obtained by adding an offset voltage ofset generated by the constant current source 350 and the resistor 335 to the voltage VMM is applied to the gate of the P channel field effect transistor 320. The source voltage VN 7 comes to VMM+ofset+Vpth. Therefore, VN8=r3×(VMM+ofset+Vpth) is generated, and the operational amplifier 355 outputs the control signal CVMM linked to a difference between the voltage VN8 and the voltage VN6 (i.e., a difference between the voltage VMM and the minimum one among the output signal OUTL, the output signal OUTR, and the voltage VSS). The VMM control circuit 120 can generate and output the control signal CVMM linked to a difference between the voltage VMM and the minimum one among the output signal OUTL, the output signal OUTR, and the voltage VSS, without use of a comparator and a switch.

As mentioned above, in the output voltage control circuit 10 of the embodiment, the high level output voltage VPP of the power source circuit 20 changes so as to follow the maximum one among the output signal OUTL, the output signal OUTR, and the voltage VSS. The low level output voltage VMM of the power source circuit 20 changes so as to follow the minimum one among the output signal OUTL, the output signal OUTR, and the voltage VSS. Specifically, in the present embodiment, the output voltages VPP and VMM of the power source circuit 20 can be controlled according to the output signal OUTL from the amplifier 30L and the output signal OUTR from the amplifier 30R that are destinations to which the operating voltage is supplied from the power source circuit 20. In addition, the VPP control circuit 110 and the VMM control circuit 120 of the embodiment do not include a comparator or a switch as a constituent element. Therefore, a circuit area of the power amplifying circuit can be made smaller than that of the power amplifying circuit having a related art configuration shown in FIGS. 23A to 23C, and the entire output voltage control circuit 10 can be miniaturized.

(C: Modification)

Figure 18:
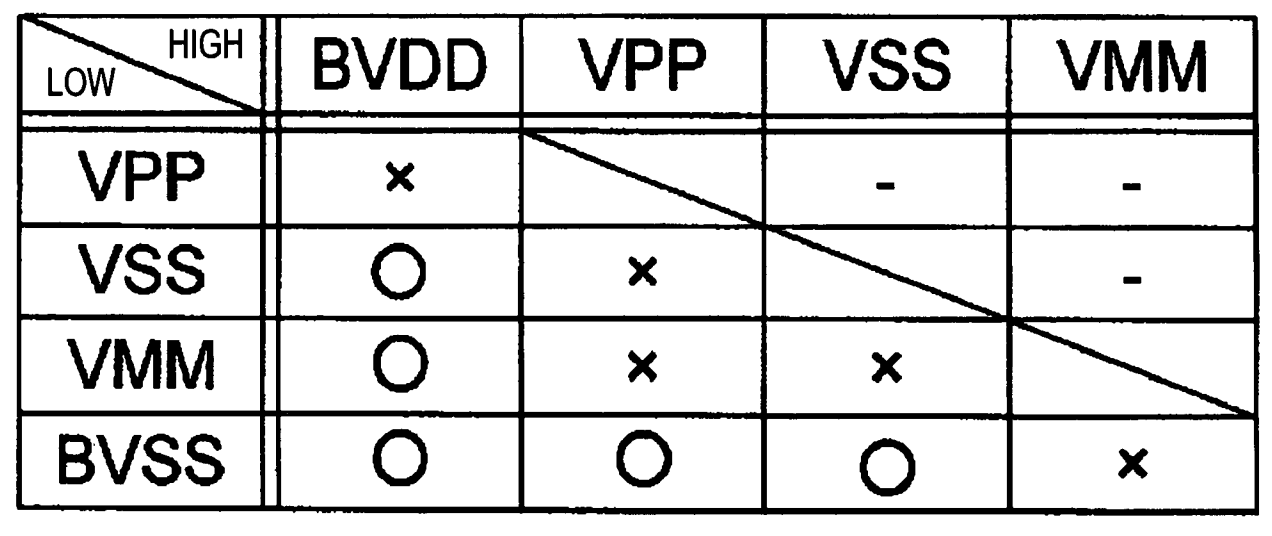

Although the third embodiment of the present invention has been described thus far, a modification, such as that mentioned below, may also be added to the embodiment. (1) In the third embodiment mentioned above, the potential difference between the voltage VSS that is a ground voltage and the BVDD that is a positive voltage is taken as an operating voltage of the power source circuit 20. The potential difference between the voltage BVDD and the voltage VSS is taken as an operating voltage of the VPP control circuit 110. The potential difference between the voltage BVDD and the voltage VMM is taken as an operating voltage of the VMM control circuit 120. However, the operating voltage of the power source circuit 20 may also be a voltage difference between the voltage VSS and the voltage BVSS or a voltage difference between the voltage BVDD and the voltage BVSS. Likewise, the operating voltages of the VPP control circuit and the VMM control circuit are not limited to the combinations mentioned above. Specifically, a conceivable combination may also be realized by selecting two types of voltages from the voltages BVDD, VPP, VSS, VMM, and BVSS, and a difference between the voltages may also be taken as an operating voltage of the VPP control circuit (or the VMM control circuit). However, it must be heeded that, if the difference between the two voltages selected from the five types of voltages is too small, the VPP control circuit and the VMM control circuit will not operate. In the case of; for instance, a combination of the voltage BVDD with the voltage VPP, the voltage BVDD is 1.8[V], and the voltage VPP fluctuates within a range from 0.2 to 1.8[V]. Therefore, there arises a case where the voltage difference between the voltage BVDD and the voltage VPP comes to about 0[V]. When the voltage difference comes to about 0[V], the circuit does not operate. When heed is paid to this point, a voltage combination that makes it possible to guarantee operation of the VPP control circuit and operation of the VMM control circuit is limited to combinations given circle signs in FIG. 18.

Figure 19:
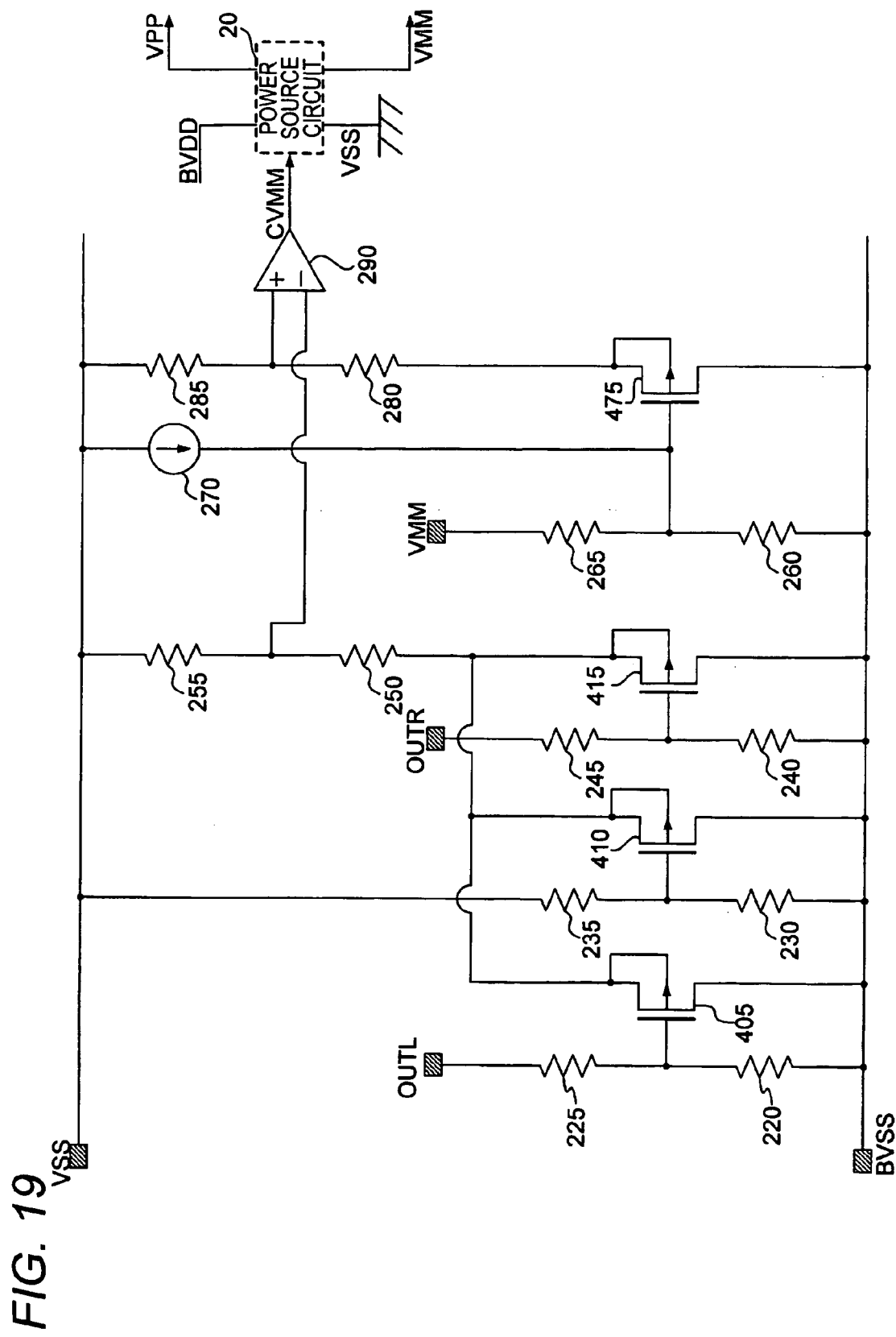
FIG. 19 is a block diagram showing another example configuration of the VMM control circuit.
Figure 20:
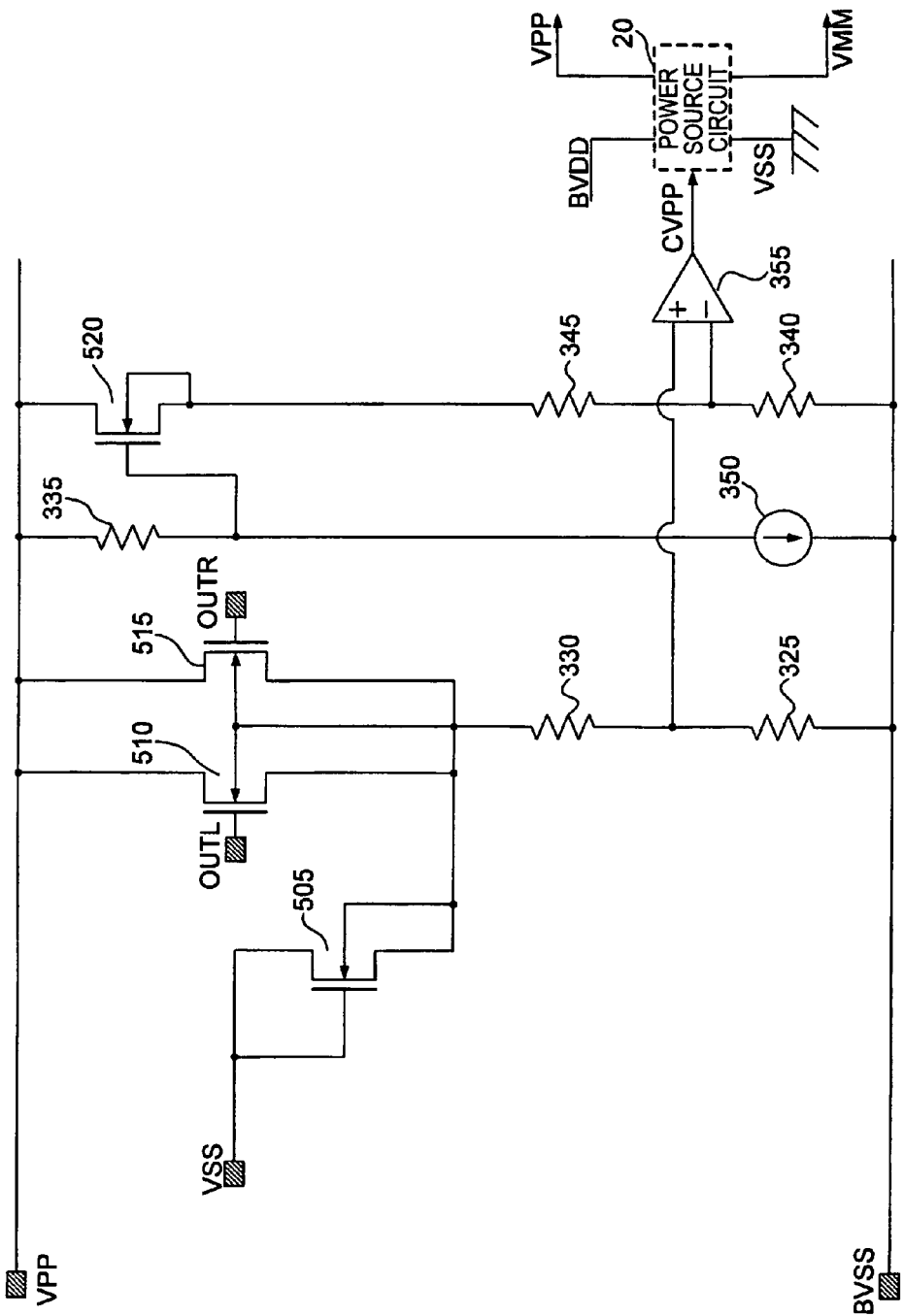
FIG. 20 is a block diagram showing another example configuration of the VPP control circuit.
Figure 21:
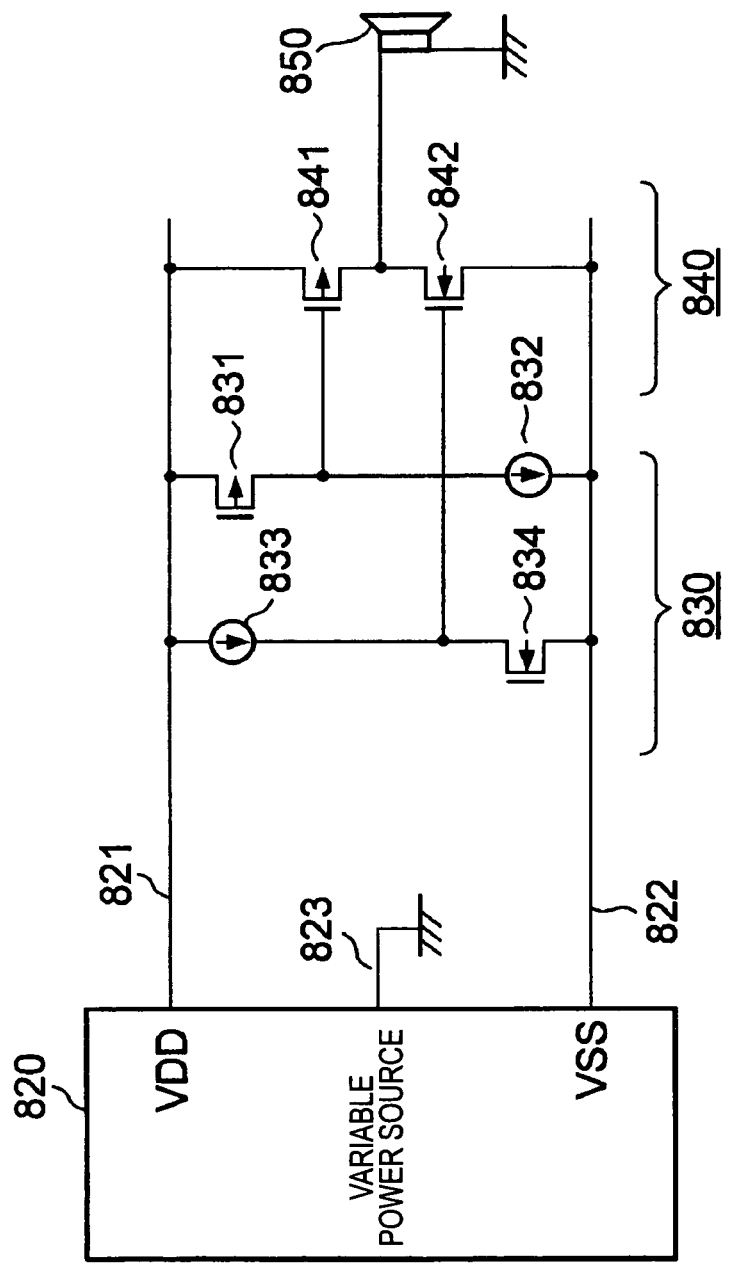
FIG. 21 is a circuit diagram showing an example configuration of a related power amplifying circuit.
Figure 22A:
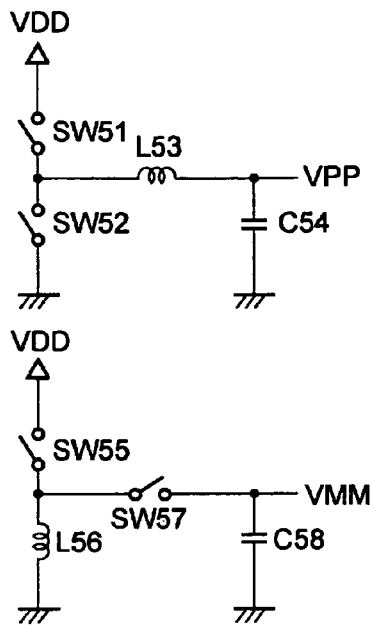
FIGS. 22A, 22B, and 22C are circuit diagrams showing an example configuration of a related DC-DC converter.
Figure 22C:
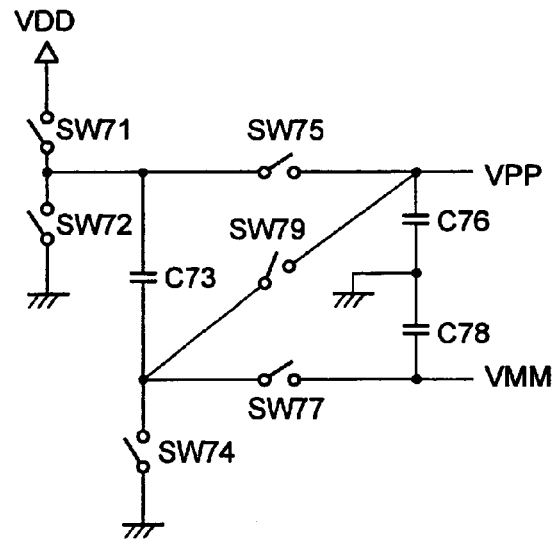
Figure 22B:
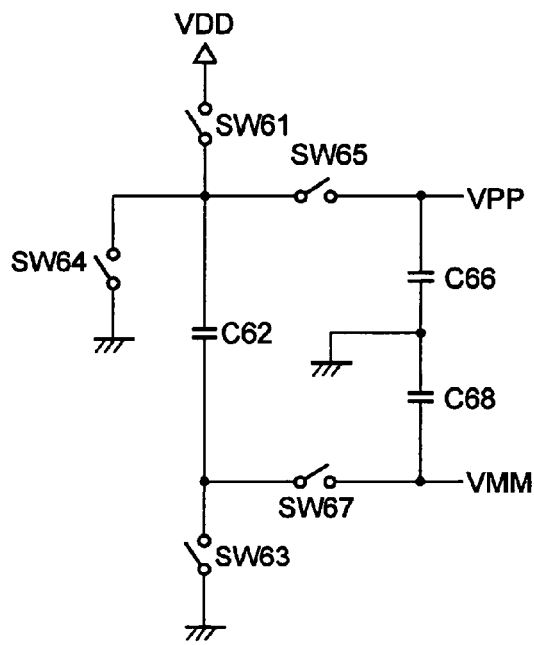

FIG. 19 is a view showing an example circuit configuration of the VMM control circuit that is supplied with the voltage VSS and the voltage BVSS and that takes a difference between the voltages as an operating voltage. As is evident from a comparison between FIGS. 19 and 16, the configuration of the VMM control circuit shown in FIG. 19 is equivalent to a configuration in which the terminal BVDD of the VPP control circuit 110 shown in FIG. 16 is replaced with the terminal BVSS and in which the N channel field effect transistors 205, 210, 215, and 275 are replaced with the P channel field effect transistors 405, 410, 415, and 475. In the VMM control circuit shown in FIG. 19, the P channel field effect transistors 405, 410, 415, and 475 work as a peak holding circuit. In the meantime, FIG. 20 is a view showing an example circuit configuration of the VPP control circuit that receives the voltage VPP and the voltage BVSS and that takes a difference between the voltages as an operating voltage. As is evident from a comparison between FIG. 20 and FIG. 17, the configuration of the VPP control circuit shown in FIG. 20 is equivalent to a configuration in which the terminal VMM of the VMM control circuit 120 shown in FIG. 17 is replaced with the terminal VPP; in which the terminal BVDD is replaced with the terminal BVSS; and in which the P channel field effect transistors 305, 310, 315, and 320 are replaced with the N channel field effect transistors 505, 510, 515, and 520. In the VPP control circuit shown in FIG. 20, the N channel field effect transistors 505, 510, and 515 work as a peak holding circuit.

(2) In the third embodiment, the negative input terminal of the operational amplifier 290 shown in FIG. 16 is supplied with the voltage VN2 (a voltage obtained by dividing the voltage VN1, which appears on the common node among the sources of the N channel field effect transistors 205, 210, and 215, by the resistors 250 and 255). Further, the positive input terminal of the operational amplifier 290 is supplied with the voltage VN4 (a voltage obtained by dividing the source voltage VN3 of the N channel field effect transistor 275 by means of the resistors 280 and 285). However, as a matter of course, the negative input terminal of the operational amplifier 290 may also be supplied with the voltage VN1, and the positive input terminal of the same may also be supplied with the voltage VN3 (in other words, the control signal CVPP whose signal level corresponds to a difference between the voltage VN3 and the voltage VN1 is output to the operational amplifier 290). In short, the resistors 250, 255, 280, and 285 are not inevitable constituent elements in the configuration of the VPP control circuit 110 shown in FIG. 16 and can be omitted. Likewise, the resistors 325, 330, 340, and 345 are not inevitable constituent elements in the configuration of the VMM control circuit 120 shown in FIG. 17 and omissible. For similar reasons, the resistors 250, 255, 280, and 285 shown in FIG. 19 are also omissible, and the resistors 325, 330, 340, and 345 shown in FIG. 20 are also omissible.

The constant current source 270 shown in FIG. 16 is for applying an offset voltage to the gate voltage of the N channel field effect transistor 275. Therefore, when such an offset supply is not required, the constant current source 270 is unnecessary. In the configuration from which the constant current source 270 is omitted, the voltage obtained by dividing the voltage VPP by means of the resistors 260 and 265 is applied to the gate of the N channel field effect transistor 275. Likewise, the constant current source 350 and the resistor 335 shown in FIG. 17 are also omissible. When these elements are omitted, it is better to adopt a configuration in which the terminal VMM is connected to the gate of the P channel field effect transistor 320.

Moreover, in the configuration shown FIG. 16, the resistors 220, 225, 230, 235, 240, 245, 260, and 265 are also omissible. When these resistors are omitted, it is better to realize a configuration in which the terminal OUTL is connected to the gate of the N channel field effect transistor 205; in which the terminal VSS is connected to the gate of the N channel field effect transistor 210; in which the terminal OUTR is connected to the gate of the N channel field effect transistor 215; and in which the terminal VPP is connected to the gate of the N channel field effect transistor 275. Likewise, the resistors 220, 225, 230, 235, 240, 245, 260, and 265 are also omissible from the configuration shown in FIG. 19. When these resistors are omitted, it is better to realize a configuration in which the terminal OUTL is connected to the gate of the P channel field effect transistor 405; in which the terminal VSS is connected to the gate of the P channel field effect transistor 410; in which the terminal OUTR is connected to the gate of the P channel field effect transistor 415; and in which the terminal VMM is connected to the gate of the P channel field effect transistor 475.

(3) In the third embodiment, the high level output voltage VPP (or the low level output voltage VMM) is adjusted so as to follow the maximum (minimum) one of the output signal OUTL from the amplifier 30L, the output signal OUTR from the amplifier 30R, and the ground voltage VSS. However, it is also better to adjust the high level output voltage VPP (or the low level output voltage VMM) so as to follow the maximum (minimum) one of the input signal INL to the amplifier 30L, the input signal INR to the amplifier 30R, and the ground voltage VSS. Such regulation is implemented by supplying the output voltage control circuit 10 with the input signal INL in lieu of the output signal OUTL and supplying the output voltage control circuit 10 with the input signal INR in lieu of the output signal OUTR. The bottom line is that a configuration includes supplying the output voltage control circuit 10 with a signal sowing operating conditions of the amplifiers 30L and 30R to which the power source circuit 20 supplies an operating voltage and adjusting the high level output voltage VPP and the low level output voltage VMM in accordance with the signals.

(4) In the third embodiment, the output voltage control circuit 10 controls the output voltage from the power source circuit 20 that supplies the speaker amplifier with an operating voltage. However, as a matter of course, it is also possible to apply the present invention to an output voltage control circuit that controls an output voltage of a power source circuit which supplies a power amplifying circuit for driving an electric motor with an operating voltage, according to an output signal from (or an input signal to) the power amplifying circuit.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2009-291350 filed on Dec. 22, 2009, Japanese Patent Application No. 2009-291501 filed on Dec. 22, 2009, Japanese Patent Application No. 2009-293998 filed on Dec. 25, 2009, and Japanese Patent Application No. 2009-294003 filed on Dec. 25, 2009, the contents of which are incorporated herein by reference.

What is claimed is:
1. A power amplifying circuit comprising:
a first load drive section and a second load drive section that drive a first load and a second load respectively, wherein each of the first load drive section and the second load drive section has a first field effect transistor of an N channel type and a second field effect transistor of the N channel type, the first field effect transistor and the second field effect transistor are connected in series and interposed between a first high potential power line and a low potential power line, and the first field effect tran- sistor and the second field effect transistor of each of the first load drive section and the second load drive section drive the first and second loads respectively;

a first predriver that generates, in response to a first input signal, gate voltages applied to the first field effect transistor and the second field effect transistor of the first load drive section respectively, wherein the first predriver has a negative power terminal connected to the low potential power line and a positive power terminal connected to a second high potential power line;

a second predriver that generates, in response to a second input signal, gate voltages applied to the first field effect transistor and the second field effect transistor of the second load drive section respectively, wherein the second predriver has a negative power terminal connected to the low potential power line and a positive power terminal connected to the second high potential power line;

a first voltage detection circuit that detects the highest voltage among an output voltage of the first load drive section, an output voltage of the second load drive section, and 0V, and that outputs a first control voltage that is a result of addition of the detected voltage to a positive offset voltage;

a second voltage detection circuit that detects the lowest voltage among the output voltage of the first load drive section, the output voltage of the second load drive section, and 0V, and that outputs a second control voltage that is a result of addition of the detected voltage to a negative offset voltage; and a variable power source that supplies a high potential power voltage equal to the first control voltage to the first and second load drive sections through the first high potential power line, and that supplies a low potential power voltage equal to the second control voltage to the first and second load drive sections through the low potential power line, wherein a second high potential power voltage supplied to the first and second predrivers through the second high potential power line is higher than the high potential power voltage supplied to the first and second load drive sections through the first high potential power line from the variable power source;

wherein in each of the first and second load drive sections, a drain of the first field effect transistor is connected to the first high potential power line, and a source of the second field effect transistor is connected to the low potential power line;

wherein in the first load drive section, a common connection point of a source of the first field effect transistor and a drain of the second field effect transistor is connected to an end of the first load; and wherein in the second load drive section, a common connection point of a source of the first field effect transistor and a drain of the second field effect transistor is connected to an end of the second load.

2. The power amplifying circuit according to claim 1, wherein the positive offset voltage is set to about +0.2V and the negative offset voltage is set to about −0.2V.

* * * * *